United States Patent
Yokozeki et al.

(10) Patent No.: US 9,455,373 B2
(45) Date of Patent: Sep. 27, 2016

(54) LIGHT EMITTING ELEMENT, METHOD OF MANUFACTURING THE SAME, AND LIGHT EMITTING DEVICE

(71) Applicant: Sony Corporation, Tokyo (JP)

(72) Inventors: Mikihiro Yokozeki, Kanagawa (JP); Takahiro Koyama, Kanagawa (JP); Hironobu Narui, Kanagawa (JP); Hidekazu Aoyagi, Miyagi (JP); Michinori Shiomi, Kanagawa (JP); Takahiko Kawasaki, Kanagawa (JP); Katsutoshi Itou, Miyagi (JP)

(73) Assignee: SONY CORPORATION, Tokyo (JP)

( * ) Notice: Subject to any disclaimer, the term of this patent is extended or adjusted under 35 U.S.C. 154(b) by 28 days.

(21) Appl. No.: 13/655,881

(22) Filed: Oct. 19, 2012

(65) Prior Publication Data

US 2013/0105836 A1 May 2, 2013

(30) Foreign Application Priority Data

Oct. 26, 2011 (JP) .................... 2011-234637
Dec. 26, 2011 (JP) .................... 2011-283570

(51) Int. Cl.
*H01L 33/26* (2010.01)
*H01L 33/02* (2010.01)
*H01L 33/44* (2010.01)

(52) U.S. Cl.
CPC ............ *H01L 33/02* (2013.01); *H01L 33/44* (2013.01)

(58) Field of Classification Search
CPC ........ H01L 33/08; H01L 33/26; H01L 33/62
USPC ......... 257/79–103, 57, 59, 66, 72, 359, 390, 257/443, E21.411, E21.412, E51.005, 257/E29.151, E27.1, E29.117; 438/30, 149, 438/158–159
See application file for complete search history.

(56) References Cited

U.S. PATENT DOCUMENTS

| | | | |
|---|---|---|---|
| 2005/0013334 A1* | 1/2005 | Watanabe | H01S 5/18311 372/44.01 |
| 2005/0187984 A1* | 8/2005 | Chen | G06F 17/30286 |
| 2006/0187984 A1* | 8/2006 | Sato | B82Y 20/00 372/43.01 |

FOREIGN PATENT DOCUMENTS

| | | |
|---|---|---|
| CN | 102157653 | 8/2011 |
| JP | HEI 02-250380 | 10/1990 |
| JP | 04-273174 | 9/1992 |
| JP | 07-038149 | 7/1995 |
| JP | 11-168259 | 6/1999 |
| JP | 11-233896 | 8/1999 |
| JP | 2004-342970 | 2/2004 |
| JP | 2004-288729 | 10/2004 |

OTHER PUBLICATIONS

Oki Data Corporation et al., Development of World's First 1.1-inch QVGA High-Intensity LED Display Has Been Succeeded; Press Release No. 091102 (Nov. 26, 2009); three pages.

(Continued)

*Primary Examiner* — Fernando L Toledo
*Assistant Examiner* — Lawrence-Linh T Nguyen
(74) *Attorney, Agent, or Firm* — Dentons US LLP

(57) ABSTRACT

A light emitting element includes: a laminated body including a first conductive semiconductor layer, an active layer, and a second conductive semiconductor layer in this order, the second conductive semiconductor layer having a light extraction surface; and a recombination suppression structure provided in vicinity of an end surface of the active layer, the recombination suppression structure having a bandgap larger than a bandgap of the active layer.

17 Claims, 26 Drawing Sheets

(56) References Cited

OTHER PUBLICATIONS

Sagimori, T et al., LED Array Haing Higher Heat Dissiptation by Epitaxial Film Bonding; Oki Technical Review, No. 216, vol. 77, No. (2010); seventeen pages.

Yonezu, H. et al., "An AlGaAs Window Structure Laser"; IEEE J. Quantum 15, (1979), pp. 775-781.

Kumakura, K. et al.; "Minority Carrier Diffusion Length in GaN: Dislocation Density and Doping Concentration Dependence"; Applied Physics Letters 86, 052105 (2005); three pages.

Japanese Office Examination Report issued in connection with related Japanese patent application No. JP 2011-283570 dated Oct. 6, 2015.

Chinese Office Action corresponding to Chinese Serial No. 201210397869.5 dated Mar. 28, 2016.

\* cited by examiner

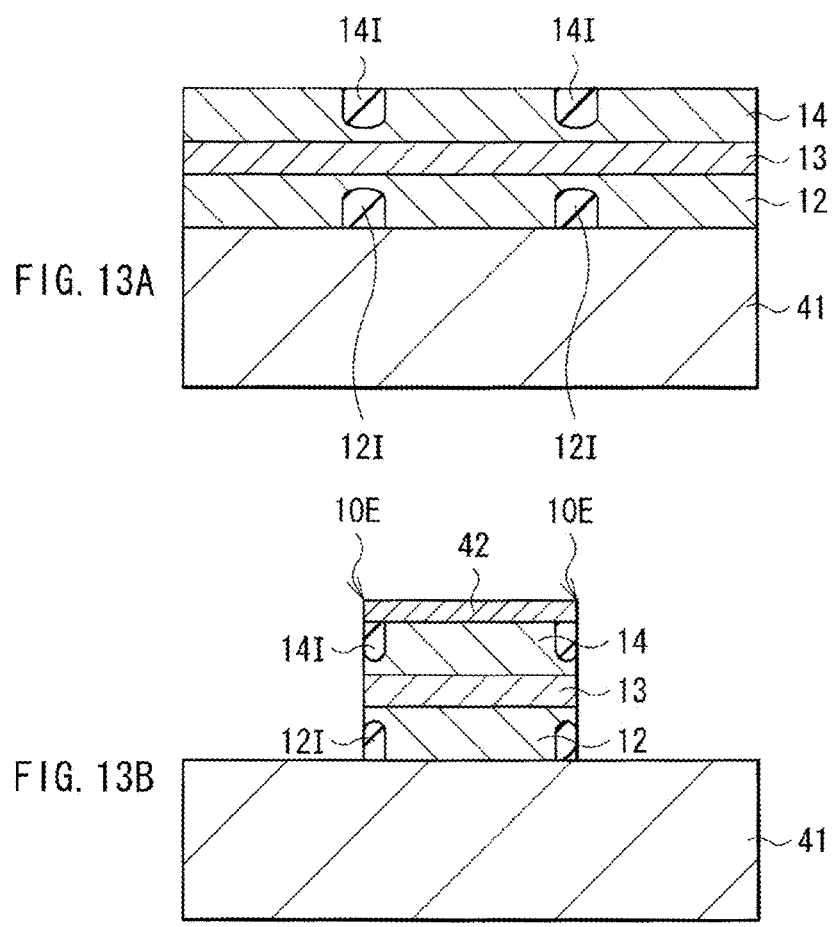

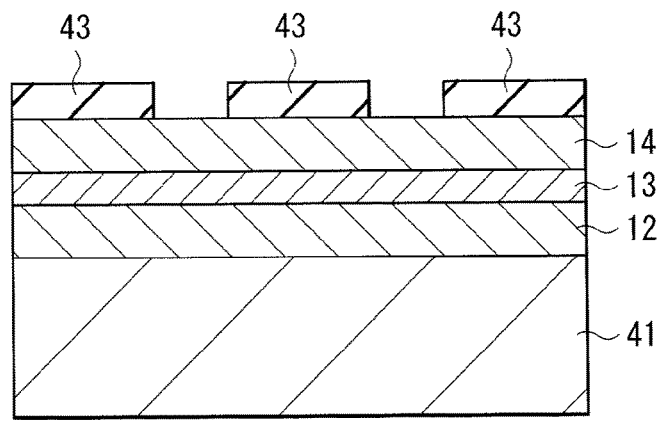
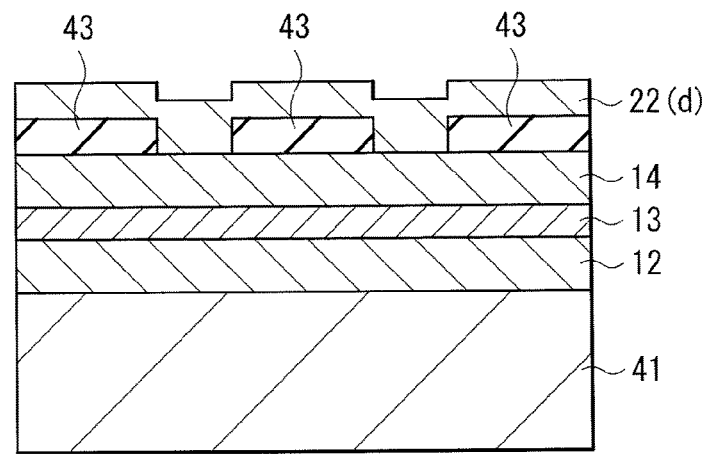
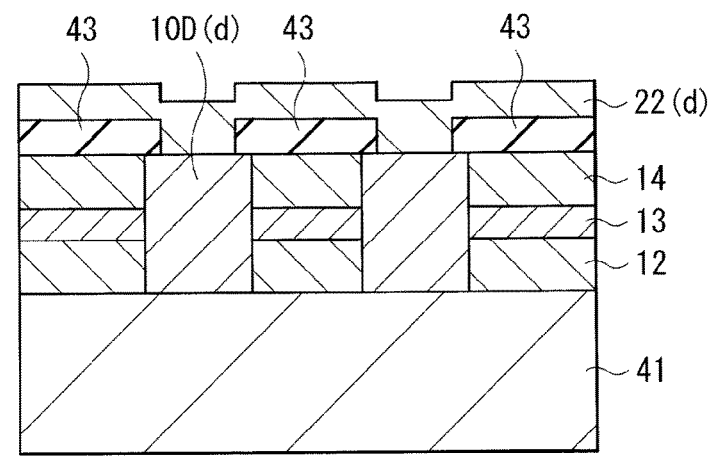

LIGHT EMITTING ELEMENT, METHOD OF MANUFACTURING THE SAME, AND LIGHT EMITTING DEVICE

BACKGROUND

The present technology relates to a light emitting element suitable for, for example, a minute LED (light emitting diode) having a light emission region of 2500 µm² or less, to a method of manufacturing the same, and to a light emitting device.

Miniaturization of a light emitting element such as a light emitting diode (LED) has been studied for applying the light emitting element to a printer and a display (for example, see OKI Technical Review No. 216, Vol. 77, No. 1 (2010), Tomohiko Sagimori et al. and Press Release No. 091102 (2009), Oki Data Corporation et al.). Such an LED has a laminated structure that includes a first conductive semiconductor layer, an active layer, and a second conductive semiconductor layer. The area of the active layer (light emission region) is equal to or less than 2500 µm².

In a printer, high resolution is achievable by arranging many LEDs being miniaturized as described above and improving arrangement density. Further, high-speed printing is achievable by increasing the light quantity of the LED. As in the printer, in a display, high resolution of its display image is achieved by miniaturizing the LED. Further, in a display using a self-luminous element such as the LED, its response speed is higher than that of a liquid crystal display, and its electric power consumption is allowed to be lowered.

SUMMARY

However, as miniaturization of the light emitting element proceeds, nonradiative recombination at the end surface of the active layer has a greater impact on its light emission efficiency. The nonradiative recombination is a phenomenon in which a carrier generated by bond of a hole and an electron does not emit light, but generates heat. The nonradiative recombination easily occurs at the end surface of the active layer. The nonradiative recombination is caused by damaging the end surface of the active layer in a manufacturing step, by dangling bonds of the active layer itself, by an impurity absorbed into the end surface, and/or the like. As miniaturization of the light emitting element has proceeded, the area ratio of a non-light emission section resulting from the nonradiative recombination at the end surface as described above has been increased, leading to lowered light emission efficiency.

It is desirable to provide a light emitting element in which the nonradiative recombination at the end surface of the active layer is suppressed and its light emission efficiency is improved, a method of manufacturing the same, and a light emitting device.

According to an embodiment of the present disclosure, there is provided a light emitting element including: a laminated body including a first conductive semiconductor layer, an active layer, and a second conductive semiconductor layer in this order, the second conductive semiconductor layer having a light extraction surface; and a recombination suppression structure provided in vicinity of an end surface of the active layer, the recombination suppression structure having a bandgap larger than a bandgap of the active layer.

According to an embodiment of the present disclosure, there is provided a light emitting device including a light emitting element, the light emitting element including: a laminated body including a first conductive semiconductor layer, an active layer, and a second conductive semiconductor layer in this order, the second conductive semiconductor layer having a light extraction surface; and a recombination suppression structure provided in vicinity of an end surface of the active layer, the recombination suppression structure having a bandgap larger than a bandgap of the active layer.

In the light emitting element and the light emitting device according to the embodiments of the present technology, the recombination suppression structure is provided in the vicinity of the end surface of the active layer. Therefore, due to a bandgap difference between the central portion of the active layer and a portion in the vicinity of the end surface of the active layer, a nonradiative recombination of an electron and a hole at the end surface is suppressed. The portion in the vicinity of the end surface of the active layer includes a portion that is in contact with the end surface of the active layer from outside and an end portion inside the active layer.

According to an embodiment of the present disclosure, there is provided a method of manufacturing the foregoing light emitting element according to the embodiment of the present technology, including: forming a laminated body including a first conductive semiconductor layer, an active layer, and a second conductive semiconductor layer in this order, the second conductive semiconductor layer having a light extraction surface; and forming a recombination suppression structure provided in vicinity of an end surface of the active layer, the recombination suppression structure having a bandgap larger than a bandgap of the active layer.

According to the light emitting element, the method of manufacturing the same, and the light emitting device according to the embodiments of the present technology, the recombination suppression structure is provided in the vicinity of the end surface of the active layer. Therefore, nonradiative recombination at the end surface of the active layer is suppressed. Accordingly, the light emission region is increased, and the light emission efficiency is improved.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIGS. 13A and 13B are cross-sectional views illustrating a method of manufacturing the light emitting element illustrated in FIGS. 12A and 12B in order of steps.

FIGS. 17A, 17B, and 17C are cross-sectional views illustrating a second example of the method of manufacturing the light emitting element illustrated in FIGS. 14A and 14B in order of steps.

DETAILED DESCRIPTION

Figure 1A:
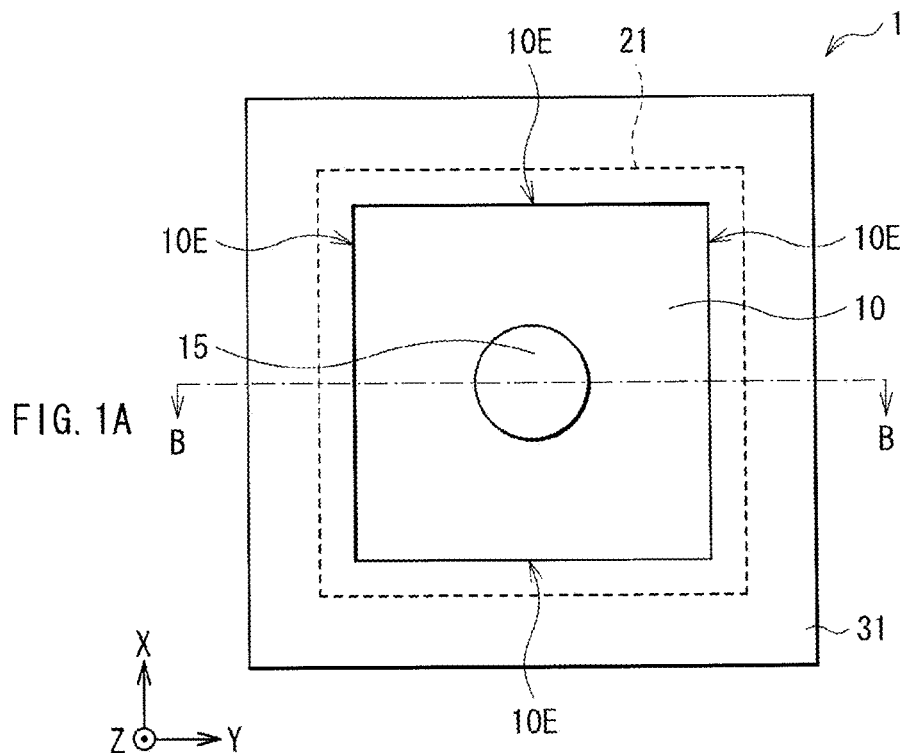
FIGS. 1A and 1B are diagrams illustrating a configuration of a light emitting element according to a first embodiment of the present disclosure.

Embodiments of the present technology will be hereinafter described in detail with reference to the drawings. The description will be given in the following order.

1. First Embodiment
An example in which an end surface of an active layer is covered with a crystallized film
2. Modification 1
An example in which a crystallized film includes a plurality of films
3. Modification 2
An example in which an insulating section is included in an end portion of a laminated body
4. Second Embodiment
An example in which a diffusion section is provided in an end portion of an active layer
5. Modification 3
An example in which an insulating section is included in an end portion of a laminated body
6. Third Embodiment
An example in which a crystallized film and a diffusion section are included
7. Modification 4
An example in which an insulating section is included in the end portion of a laminated body
8. Application Examples

[First Embodiment]

Figure 1B:
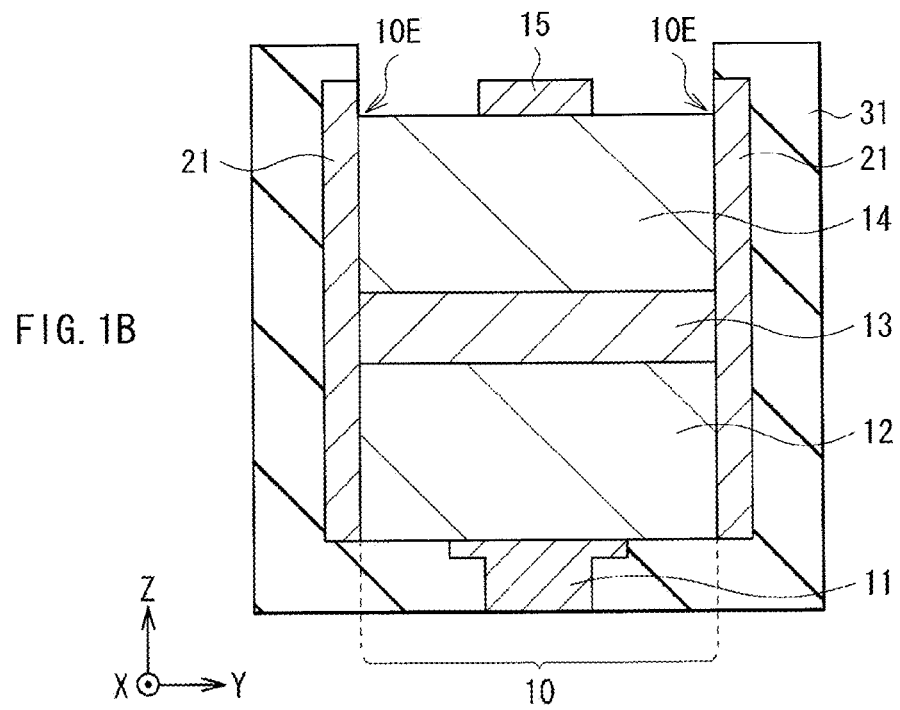

FIGS. 1A and 1B illustrate a configuration of a light emitting element (light emitting element 1) according to a first embodiment of the present disclosure. FIG. 1A illustrates a configuration of a top surface (plane surface) of the light emitting element 1, and FIG. 1B illustrates a configuration of a cross section taken along a line B-B of FIG. 1A. For example, the light emitting element 1 has a laminated body 10 in the shape of a square pole. The surface of the laminated body 10 other than a light extraction surface (top surface of the laminated body 10) is surrounded by an insulating film 31. A crystallized film 21 exists between the insulating film 31 and an end surface 10E (side surface) of the laminated body 10. In the light emitting element 1, a recombination suppression structure is configured of the crystallized film 21.

The laminated body 10 is an LED, and has an n-side electrode 11, a buffer layer (not illustrated), an n-type cladding layer 12 (first conductive semiconductor layer), an active layer 13, a p-type cladding layer 14 (second conductive semiconductor layer), a contact layer (not illustrated), and a p-side electrode 15 in this order. In the light emitting element 1, the active layer 13 emits light with the wavelength corresponding to the bandgap thereof, and the emitted light is extracted from a surface of the p-type cladding layer 14 located on an opposite side of the p-type cladding layer 14 from the surface of the p-type cladding layer 14 opposed to the active layer 13 (in the upward direction in FIG. 1B). That is, the p-type cladding layer 14 has the light extraction surface, and emitted light is extracted in a direction perpendicular to the surface of the active layer 13 (Z-axis direction). The n-side electrode 11 injects a current into the semiconductor layers (the n-type cladding layer 12, the active layer 13, and the p-type cladding layer 14) together with the p-side electrode 15. For example, the n-side electrode 11 has a laminated structure in which an alloy (AuGe) of gold (Au) and germanium (Ge), nickel (Ni), and gold are laminated in this order of closeness to the n-type cladding layer 12 (AuGe/Ni/Au). For example, the p-side electrode 15 has a laminated structure in which titanium (Ti), platinum (Pt), and gold are laminated in this order of closeness to the p-type cladding layer 14 (Ti/Pt/Au). For example, the n-type cladding layer 12 is configured of n-type $(Al_{0.7}Ga_{0.3})_{0.5}In_{0.5}P$ having a thickness of 1000 nm to 2000 nm both inclusive and a carrier concentration of about $1\times10^{18}$ $cm^3$. The active layer 13 has a quantum well structure in which a well layer configured of InGaP having a thickness of 3 nm to 10 nm both inclusive and a barrier layer configured of $(Al_{0.6}Ga_{0.4})_{0.5}In_{0.5}P$ having a thickness of 10 nm to 100 nm both inclusive are laminated alternately for 10 QW. For example, the p-type cladding layer 14 is configured of p-type $(Al_{0.7}Ga_{0.3})_{0.5}In_{0.5}P$ having a thickness of 300 nm to 1000 nm both inclusive and a carrier concentration of $1\times10^{17}$ $cm^3$ to $1\times10^{18}$ $cm^3$ both inclusive. For example, the laminated body 10 is in the shape of a square with one side being 15 µm long in a plane view, and the area of the active layer 13 (light emission region) is 225 $µm^2$.

The crystallized film 21 is provided in the vicinity of the end surface 10E of the laminated body 10. More specifically, the crystallized film 21 is in contact with the end surface 10E, and coverers the end surface 10E from outside. Non-radiative recombination occurring at the end surface of the active layer 13 is suppressed by the crystallized film 21. In this case, the end surface 10E of the whole laminated body 10 is covered with the crystallized film 21. However, it is enough that at least an end surface of the active layer 13 is covered with the crystallized film 21. A component material of the crystallized film 21 preferably has a larger bandgap than that of a component material of the active layer 13, and preferably contains one or more of elements contained in the active layer 13. For example, the crystallized film 21 is configured of AlInP, AlGaInP, AlGaAs, AlAs, $Al_2O_3$, AlN, and/or the like. Part or all of the crystallized film 21 may be oxidized. For example, the crystallized film 21 containing $Al_2O_3$ may be formed by forming a film containing Al such as an AlAs film on the end surface 10E and subsequently oxidizing part or all thereof. In the case where the crystallized film 21 containing $Al_2O_3$ is formed, the AlAs film is allowed to be formed without damage, and occurrence of a leak current in the crystallized film 21 is allowed to be prevented by insulative $Al_2O_3$. Further, in the case where the light emitting element 1 has the crystallized film 21 configured of $Al_2O_3$, the insulating film 31 may be omitted due to insulation of $Al_2O_3$. The crystal structure of the crystallized film 21 is preferably the same as that of the active layer 13. For example, in the case where the active layer 13 has a zinc blende structure, the crystal structure of the crystallized film 21 preferably has a zinc blende structure as well.

The crystallized film 21 preferably has, for example, a thickness equal to or smaller than 100 nm, and preferably has a high resistance, since a leak current is thereby prevented from flowing into the crystallized film 21, and a light emission intensity of the light emitting element 1 is thereby prevented from being lowered. In the case where the crystallized film 21 is an insulating film such as MN, the thickness of the crystallized film 21 may be larger than 100 nm. The thickness of the crystallized film 21 has no lower limit value. Any thickness of the crystallized film 21 may be adopted as long as the crystallized film 21 is allowed to wholly cover the end surface of the active layer 13.

The insulating film 31 protects the laminated body 10. The insulating film 31 covers the end surface 10E of the laminated body 10 with the crystallized film 21 in between, and covers the bottom surface of the laminated body 10 (surface of the laminated body 10 on the n-side electrode 11 side). The insulating film 31 is configured of, for example, $SiO_2$, SiN, or $Al_2O_3$.

The light emitting element 1 may be manufactured, for example, as follows.

Figure 2A:
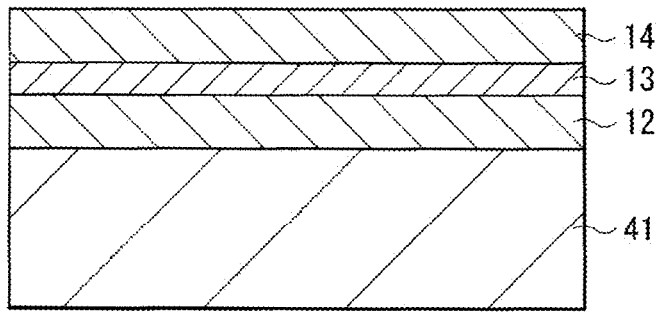
FIGS. 2A, 2B, and 2C are cross-sectional views illustrating a method of manufacturing the light emitting element illustrated in FIGS. 1A and 1B in order of steps.
Figure 2B:
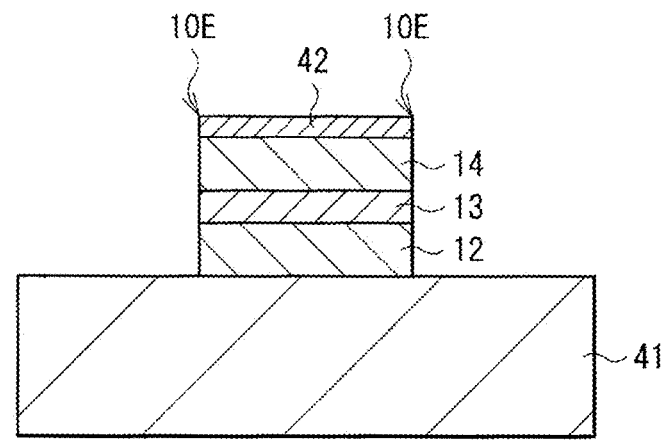

First, on a crystal growth substrate 41 configured of, for example, GaAs, the buffer layer (not illustrated), the n-type cladding layer 12 configured of n-type $(Al_{0.7}Ga_{0.3})_{0.5}In_{0.5}P$, the active layer 13 having a laminated structure of InGaP and $(Al_{0.6}Ga_{0.4})_{0.5}In_{0.5}P$, the p-type cladding layer 14 configured of p-type $(Al_{0.7}Ga_{0.3})_{0.5}In_{0.5}P$, and the contact layer (not illustrated) are formed in this order (FIG. 2A). The In composition of InGaP of the active layer 13 is previously adjusted so that emitted light has a desired wavelength. Next, a mask 42 configured of, for example, $SiO_2$ is provided on the p-type cladding layer 14, and etching is performed down to the crystal growth substrate 41, and thereby, the buffer layer, the n-type cladding layer 12, the active layer 13, and the p-type cladding layer 14 are shaped into a square with one side being 15 µm long, for example (FIG. 2B). The etched surface becomes the end surface 10E of the laminated body 10. The etching is performed by, for example, dry etching.

Subsequently, the mask 42 is removed by fluorinated acid-based etchant. The buffer layer, the n-type cladding layer 12, the active layer 13, and the p-type cladding layer 14 that are shaped are annealed, for example, for 1 hour at 700 deg C. or more under $PH_3$ (phosphine) gas atmosphere in an MOCVD (metal organic chemical vapor deposition) oven. By such annealing, impurities adhering to the n-type cladding layer 12, the active layer 13, and the p-type cladding layer 14 are removed, and crystal defects of the end surface 10E damaged by the etching are improved. The annealing is preferably performed at temperature higher than the temperature at which an oxidized film adhering to the end surface and the top surface is removable such as temperature of 700 deg C. or more. One reason for this is that crystallinity of the crystallized film 21 to be formed next is thereby improved, and restoration of the end surface 10E as described above is thereby achievable effectively. Further, the annealing is preferably performed under a gas atmosphere containing an element included in the crystallized film 21. By such an annealing step, nonradiative recombination at the end surface 10E is suppressed.

Figure 2C:
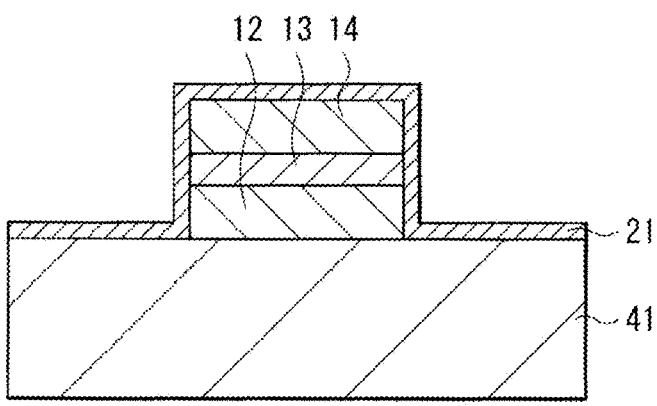

After the annealing, by an MOCVD method, the crystallized film 21 configured of, for example, AlInP is formed to cover the top surface of the p-type cladding layer 14 and four sides of the end surface 10E (FIG. 2C). At this time, the crystallized film 21 is formed so that the thickness thereof at the end surface 10E becomes, for example, about 50 nm. It has been confirmed that the crystallized film 21 is formed on the top surface of the p-type cladding layer 14 and the end surface 10E and that the end surface of the active layer 13 is securely covered with the crystallized film 21, by an SEM (scanning electron microscope) image after forming the crystallized film 21 and an STEM (scanning transmission electron microscope) image of a cross section thereof. Further, it has been also confirmed that the crystallized film 21 has a crystal structure, by crystal defect (dislocation) of the crystallized film 21 observed in the STEM image. It is enough that, out of the crystallized film 21, a portion in contact with the end surface of the active layer 13 is crystallized at minimum.

The crystallized film 21 may be formed by, for example, an MBE (molecular beam epitaxy) method, a PLD (pulse laser deposition) method, or a sputtering method in addition to an MOCVD method. For example, the crystallized film 21 configured of MN may be formed by a sputtering method, specifically by an ECR (electron cyclotron resonance) sputtering method. By using an MOCVD method, crystallinity of the crystallized film 21 is improved and nonradiative recombination is suppressed effectively. By using a sputtering method, the crystallized film 21 is formed simply.

Figure 3A:
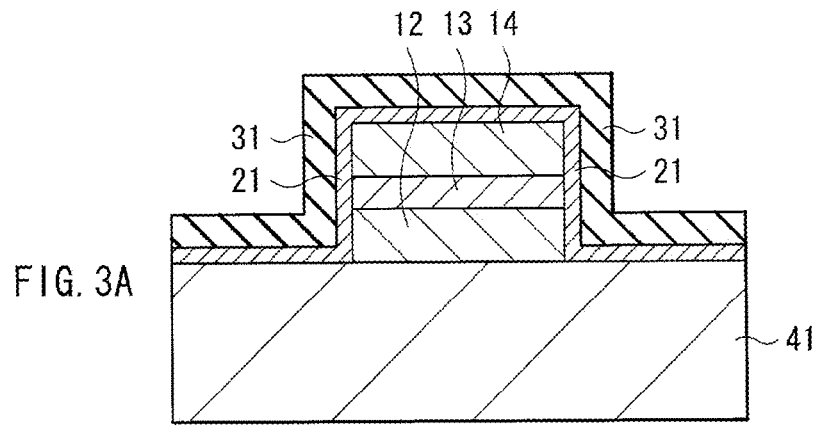
FIGS. 3A, 3B, and 3C are cross-sectional views illustrating steps following the step of FIG. 2C.
Figure 3B:
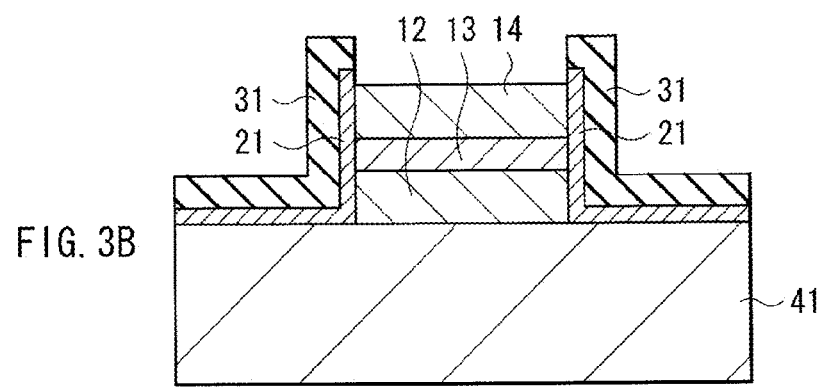
Figure 3C:
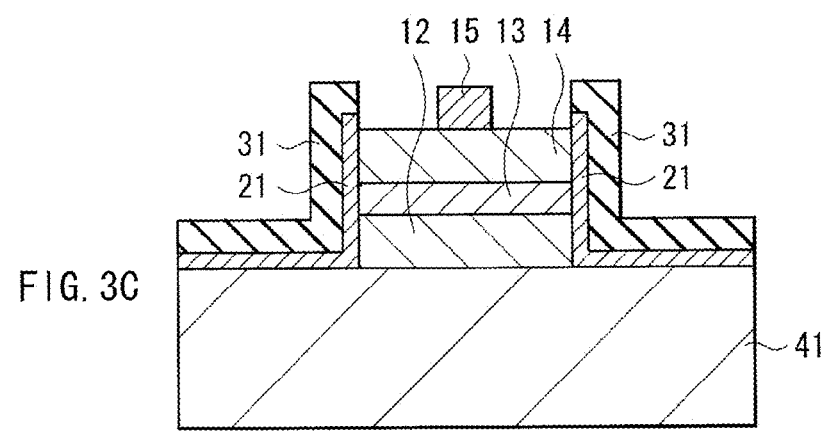

After the crystallized film 21 is formed, the insulating film 31 is formed on the crystallized film 21 (FIG. 3A). Next, after the crystallized film 21 and the insulating film 31 on the surface (top surface) of the p-type cladding layer 14 are removed by etching (FIG. 3B), the p-side electrode 15 is formed (FIG. 3C). The top surface of the p-type cladding layer 14 in which the crystallized film 21 and the insulating film 31 are removed becomes a light extraction surface.

Subsequently, the crystal growth substrate 41 is removed to form the n-side electrode 11. Accordingly, the light emitting element 1 illustrated in FIGS. 1A and 1B is completed.

In the light emitting element 1, in the case where a predetermined voltage is applied between the p-side electrode 15 and the n-side electrode 11, an electron from the n-side electrode 11 and a hole from the p-side electrode 15 are respectively injected into the active layer 13. The electron and the hole injected into the active layer 13 are recombined, and thereby a photon is generated, resulting in emitted light. The emitted light is extracted from the top surface side of the p-type cladding layer 14. In this case, the end surface 10E is covered with the crystallized film 21. Therefore, nonradiative recombination at the end surface of the active layer 13 is suppressed by the crystallized film 21. Details thereof will be hereinafter given.

Figure 4A:
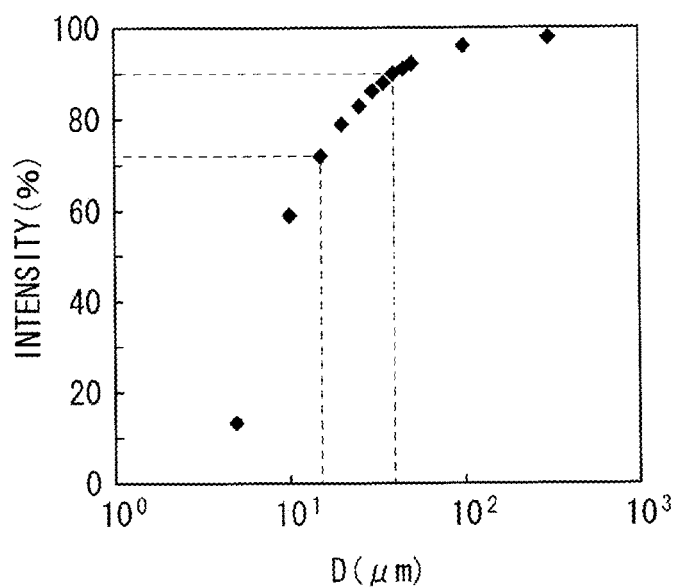
FIGS. 4A and 4B are diagrams illustrating a relation between a size of a light emitting element and light emission intensity thereof.
Figure 4B:
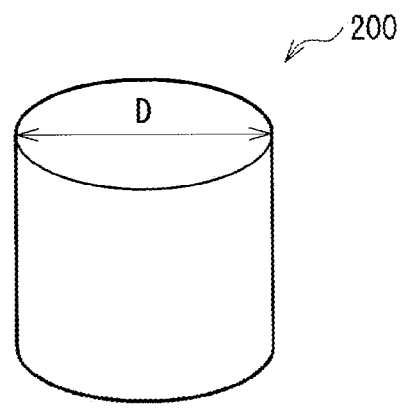

FIG. 4A illustrates a result of calculating a relation between a size (area of an active layer) of a light emitting element and a light emission intensity thereof by using a light emitting element 200 as a calculation model illustrated in FIG. 4B. The light emitting element 200 is a light emitting element in the shape of a column having a diameter of D μm with a carrier diffusion length of 2 μm. From the calculation result, it is found that, in the case where the size of the light emitting element is decreased, nonradiative recombination at the end surface of the active layer has a greater impact on the light emission efficiency, and the light emission efficiency is decreased. For example, in the case where the area of the active layer is about 2500 μm$^2$ (diameter D is about 60 μm), the light emission efficiency is decreased by about 10%. For example, in the case where the area of the active layer is about 180 μm$^2$ (diameter D is about 15 μm), the light emission efficiency is decreased by about 30%.

In the field of laser diodes, several methods for preventing optical damage of an end surface of an active layer have been proposed (for example, IEEE J. Quantum Electron., QE-15,775 (1979), and Japanese Unexamined Patent Application Publication Nos. H11-233896 and H11-168259). However, since the end surface of the active layer of the laser diode is a surface from which light is emitted, and the size thereof is largely different from that of a miniaturized LED, it is difficult to directly apply the foregoing methods to LEDs.

In addition to the size of the light emitting element, the carrier diffusion length affects the light emission efficiency. For example, in the case where the active layer is made of an Al-, In-, Ga-, P-, or As-based material (material emitting red light), the carrier surface recombination rate is about $1 \times 10^5$ (cm/s), which is faster than those of other materials such as silicon ($1 \times 10^3$ (cm/s)) and GaN ($1 \times 10^4$ (cm/s)). Therefore, the diffusion length of the Al-, In-, Ga-, P-, or As-based material in bulk is about 2 μm, which is long. This refers to a state where, the light emission intensity at a distant of about 2 μm from the end surface of the active layer is about 67%. This also refers to a state where out of the light emission region, the outer periphery (end portion) being 2 μm wide becomes a non-light emission portion. Meanwhile, the diffusion length of an N-based material such as GaN (material emitting blue light) is several hundred nanometers (Applied Physics Letters 86 052105 (2005)), which is shorter than that of the foregoing Al-, In-, Ga-, P-, or As-based material. That is, in the N-based material, the area of the non-light emission portion is small, and nonradiative recombination at the end surface of the active layer has a smaller impact on the light emission efficiency. Meanwhile, in the Al-, In-, Ga-, P-, or As-based material having a longer diffusion length, nonradiative recombination at the end surface of the active layer has a greater impact on the light emission efficiency. Therefore, in the case where the active layer 13 contains one or more elements of Al, In, Ga, P, and As, an effect of the crystallized film 21 becomes greater.

Figure 5A:
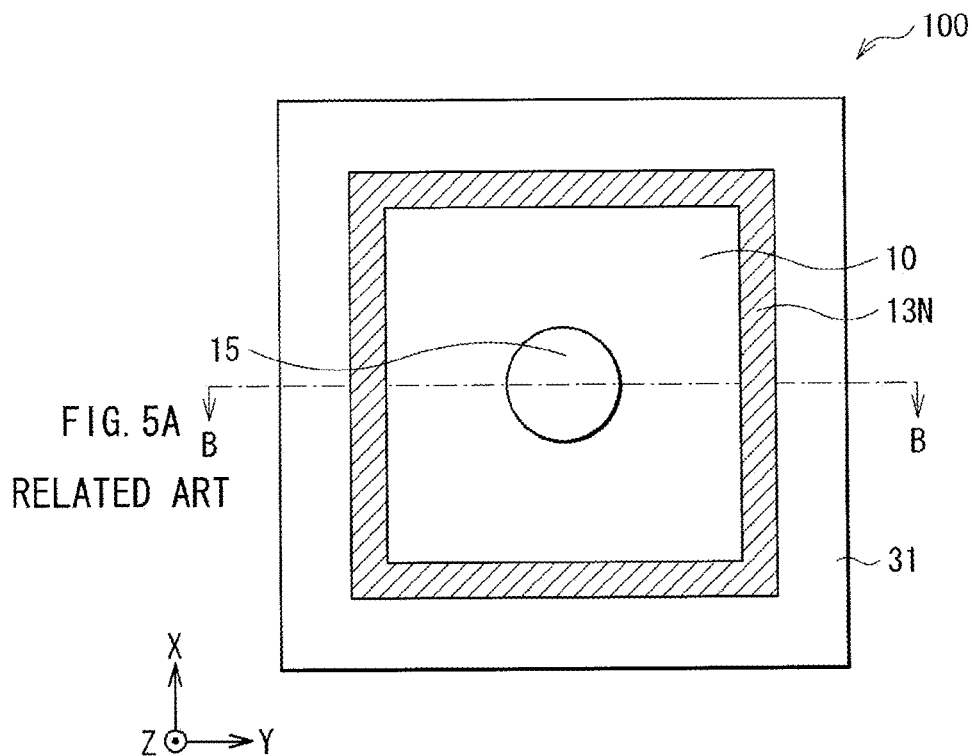
FIGS. 5A and 5B are diagrams illustrating a configuration of a light emitting element according to a comparative example.
Figure 5B:
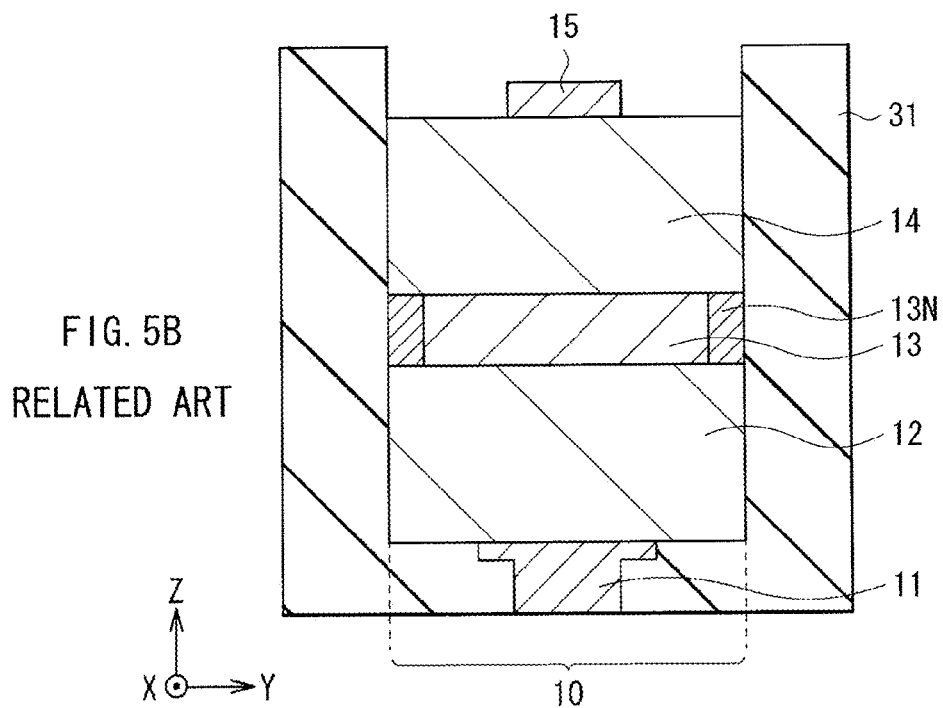

FIGS. 5A and 5B illustrate cross-sectional configurations of a light emitting element (light emitting element 100) according to a comparative example. FIG. 5A illustrates a configuration of a top surface (plane surface) of the light emitting element 100, and FIG. 5B illustrates a configuration of a cross section taken along a line B-B of FIG. 5A. As the light emitting element 1, the light emitting element 100 has the laminated body 10, and the area of the active layer is equal to or less than 2500 μm$^2$. However, the crystallized film does not exist at the end surface 10E of the laminated body 10, and the end surface 10E is directly covered with the amorphous insulating film 31 configured of, for example, SiO$_2$ or SiN. In such a light emitting element 100, nonradiative recombination at the end surface of the active layer 13 is not allowed to be suppressed, and a non-light emission portion 13N occurs in the vicinity of the end surface. Thus, the light emission region is narrowed, and accordingly the light emission efficiency is lowered. By comparing the light emitting element 100 to the light emitting element 1 according to this embodiment, the effect of the crystallized film 21 was confirmed.

Figure 6:
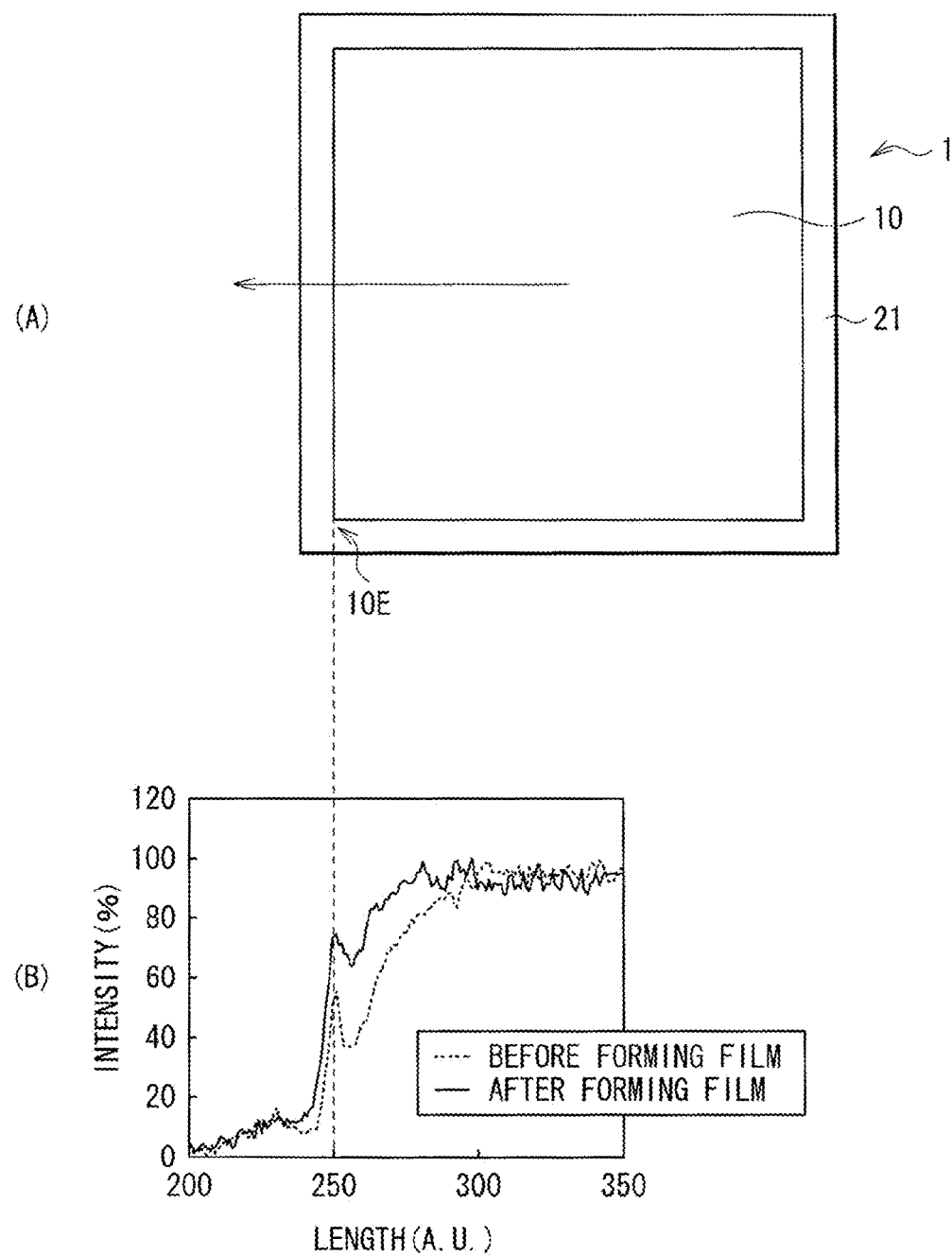
FIG. 6 is a diagram illustrating intensity line profiles of a PL (photo luminescence) image of the light emitting element illustrated in FIGS. 1A and 1B.
Figure 7:
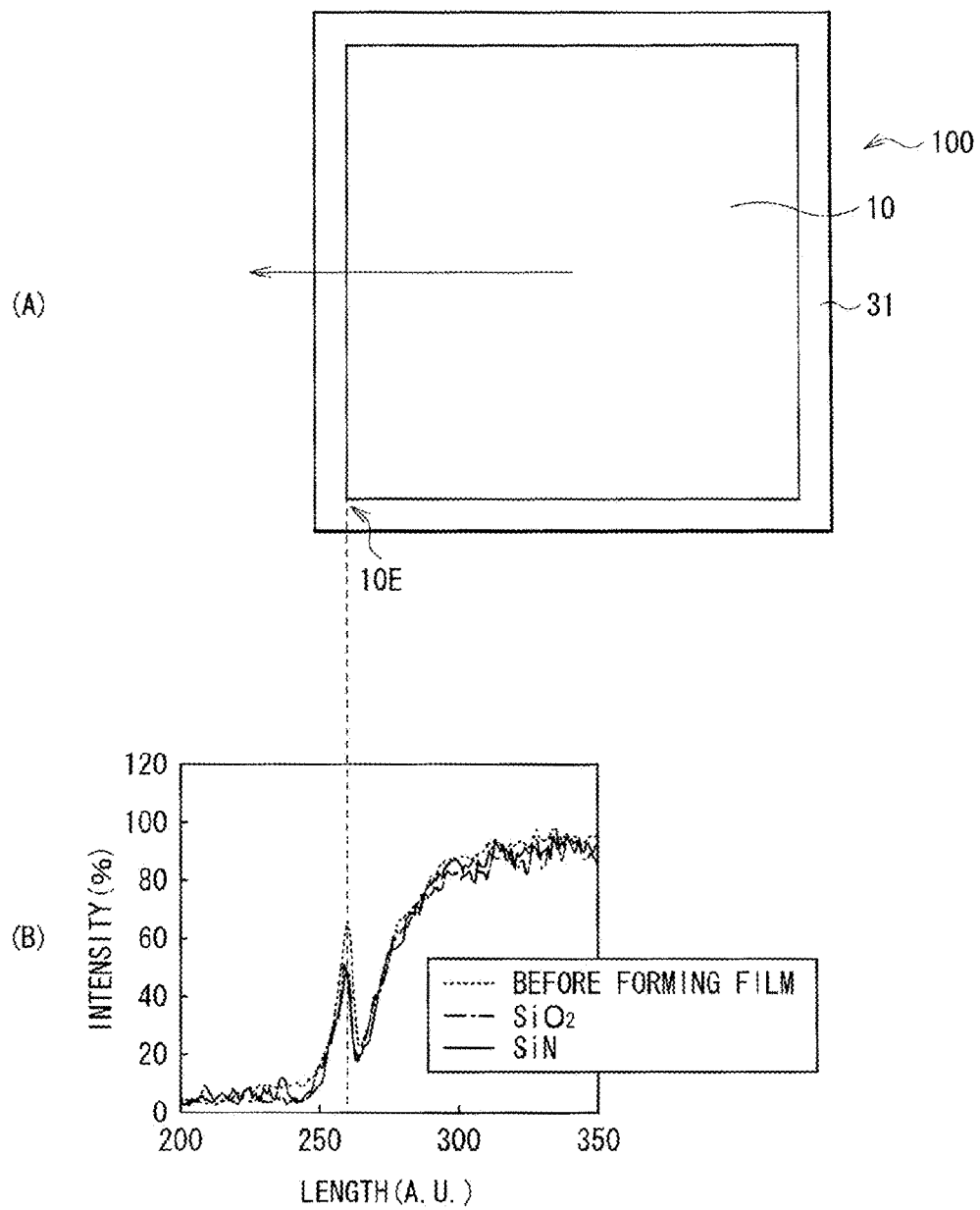
FIG. 7 is a diagram illustrating intensity line profiles of a PL image of the light emitting element illustrated in FIGS. 5A and 5B.

First, light emission characteristics of the light emitting element 1 and the light emitting element 100 were examined by using a PL method. FIG. 6 illustrates the result of the light emitting element 1, and FIG. 7 illustrates the result of the light emitting element 100. PL light emission intensities in arrow directions of Part (A) of FIG. 6 and Part (A) of FIG. 7 were examined Part (B) of FIG. 6 and Part (B) of FIG. 7 illustrate intensity line profiles of the PL images thereof. Dashed lines of Part (B) of FIG. 6 and Part (B) of FIG. 7 represent states after etching the n-type cladding layer 12, the active layer 13, and the p-type cladding layer 14 (before forming the crystallized film 21 and the insulating film 31). The full line of Part (B) of FIG. 6 represents a state after forming the crystallized film 21 configured of AlInP, and the full line of Part (B) of FIG. 7 represents a state after forming the insulating film 31 configured of SiO$_2$ or SiN. From the results, it is found that the light emission intensity is not changed even after forming the insulating film 31, while the light emission intensity in the vicinity of the end surface of the active layer 13 (length: from 250 to 290 A. U. both inclusive) is improved after forming the crystallized film 21. Rise of the PL light emission intensities at the end surface 10E in Part (B) of FIG. 6 and Part (B) of FIG. 7 results not from light emitted from inside of the light emitting element 1 and the light emitting element 100, but from light extracted in a lateral direction from the side surface thereof.

Figure 8:
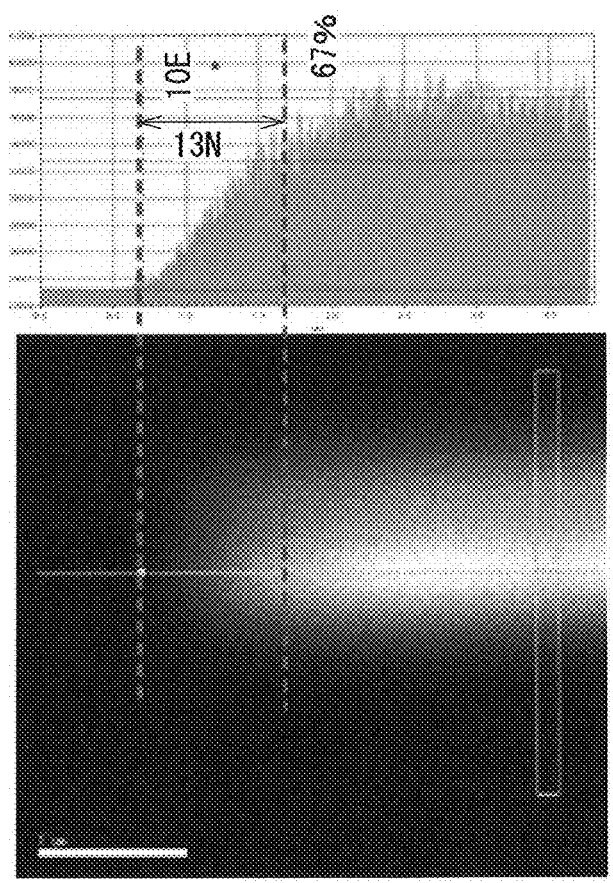
FIG. 8 is a diagram illustrating a CL (cathode luminescence) image of the light emitting element illustrated in FIGS. 1A and 1B.

Next, before and after forming the crystallized film 21, the light emitting element 1 was cleaved. The light emission characteristics of the cross sections thereof were examined by using a CL method. The length of the non-light emission portion (non-light emission portion 13N) was 0.98 μm before forming the crystallized film 21, while the length thereof was decreased down to 0.13 μm after forming the crystallized film 21. The CL method is a method in which, as illustrated in FIG. 8, the active layer is directly excited and CL light emission is seen from the direction of the cleaved cross section. Therefore, in the CL method, observation is achievable while influences of light emission from the side surface is suppressed compared to in the PL method.

Figure 9:
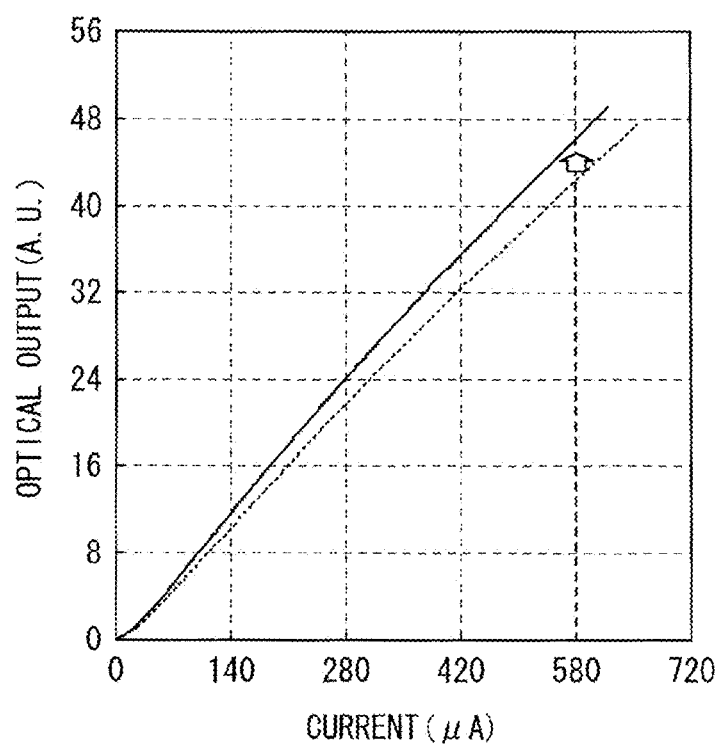
FIG. 9 is a diagram illustrating light emission efficiency of the light emitting element illustrated in FIGS. 1A and 1B and the light emitting element illustrated in FIGS. 5A and 5B.

FIG. 9 illustrates current-optical output (1-L) characteristics of the light emitting element 1 and the light emitting element 100. The full line represents the characteristics of the light emitting element 1, and the dashed line represents the characteristics of the light emitting element 100. It is to be noted that FIG. 9 represents results of measurement in a state before removing the crystal growth substrate 41. For example, in the case where the drive current is 580 μA, the optical output of the light emitting element 1 is improved by about 10% compared to that of the light emitting element 100. Therefore, from the foregoing results, it was confirmed that the crystallized film 21 suppresses nonradiative recombination at the end surface of the active layer 13 to widen the light emission region, and thereby improves the device characteristics.

The foregoing suppression of the nonradiative recombination at the end surface 10E by the crystallized film 21 is achieved for the following reason.

Figure 10A:
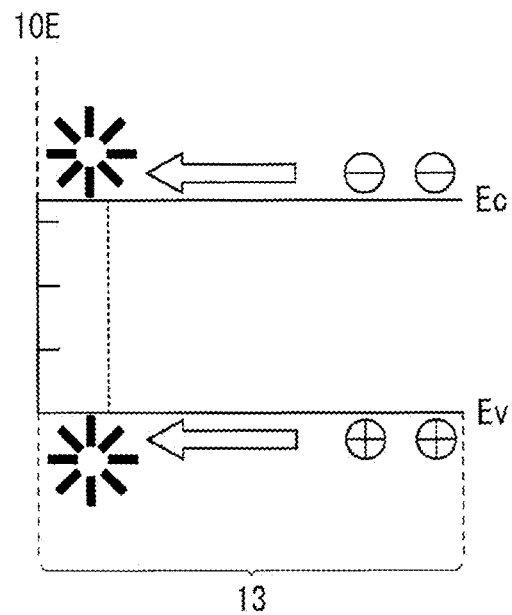
FIGS. 10A and 10B are diagrams schematically illustrating energy bands of an active layer and a crystallized film illustrated in FIGS. 1A and 1B.
Figure 10B:
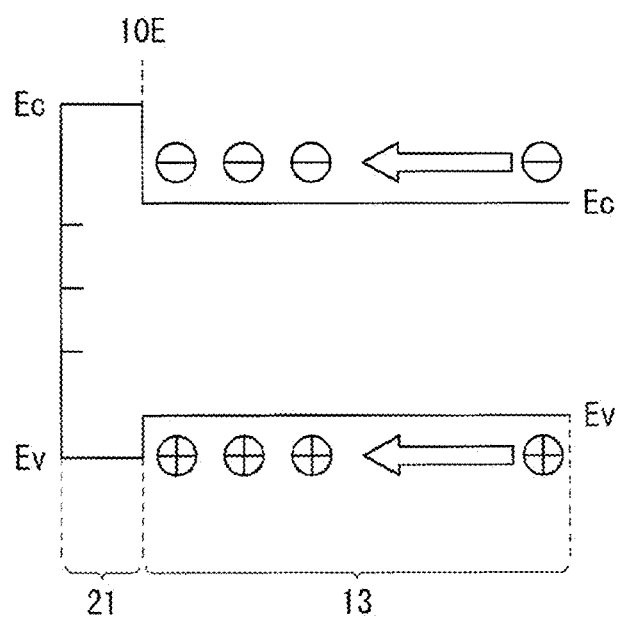

FIG. 10A schematically illustrates a band structure before forming the crystallized film 21, and FIG. 10B schematically illustrates a band structure after forming the crystallized film 21. In the case where the n-type cladding layer 12, the active layer 13, and the p-type cladding layer 14 are etched, a portion in the vicinity of the etched end surface 10E is damaged, and band shrinkage (shrinkage of the bandgap) occurs. Therefore, nonradiative recombination easily occurs. In addition thereto, the nonradiative recombination may occur due to occurrence of deep level (deep defect level) caused by dangling bonds of the active layer 13 itself, an impurity absorbed into the end surface, and/or the like (FIG. 10A). By providing the crystallized film 21 having a larger bandgap than that of the active layer 13 at the end surface 10E, the well layer of the active layer 13 is not exposed (FIG. 10B), and nonradiative recombination is suppressed.

As described above, in this embodiment, the end surface 10E of the laminated body 10 is covered with the crystallized film 21. Therefore, nonradiative recombination at the end surface 10E is suppressed. Accordingly, the light emission region of the active layer 13 is widened, and thereby, the light emission efficiency of the light emitting element 1 is improved.

Further, by performing annealing at 700 deg C. or more before forming the crystallized film 21, the crystal structure of the end surface 10E of the laminated body 10 that is damaged by etching is restored, and nonradiative recombination is suppressed more effectively.

A description will be hereinafter given of modifications of the foregoing first embodiment and other embodiments. In the following description, for the same components as the components in the foregoing first embodiment, the same referential symbols are affixed thereto, and the description thereof will be omitted as appropriate.

[Modification 1]

Figure 11:
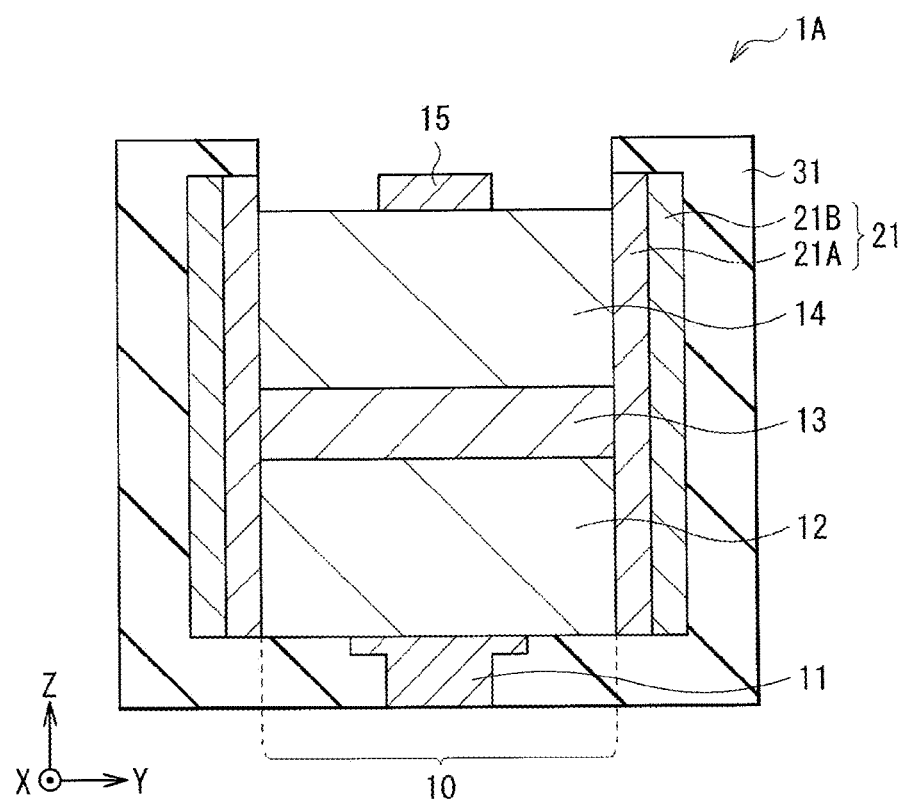
FIG. 11 is a cross-sectional view illustrating a configuration of a light emitting element according to a modification 1.

FIG. 11 illustrates a cross-sectional configuration of a light emitting element (light emitting element 1A) according to a modification 1 of the foregoing first embodiment. The light emitting element 1A is different from the light emitting element 1 according to the first embodiment in that the crystallized film 21 includes a plurality of films (a crystallized film 21A and a crystallized film 21B). Except for this point, the light emitting element 1A has a configuration similar to that of the light emitting element 1 according to the first embodiment, and its function and its effect are similar to those of the light emitting element 1 according to the first embodiment.

The crystallized film 21A and the crystallized film 21B are arranged in this order of closeness to the laminated body 10, and have, for example, bandgaps with different sizes. That is, the crystallized film 21B is arranged more distant from the active layer 13 than the crystallized film 21A is. The bandgap of the crystallized film 21B is preferably larger than the bandgap of the crystallized film 21A. For example, in the case where the crystallized film 21A is configured of AlGa$_x$As (X>0) and the crystallized film 21B is configured of AlAs, the hetero interface becomes smooth, and a leak current at the interface is allowed to be decreased. Further, the insulative crystallized film 21B containing Al$_2$O$_3$ is allowed to be formed by forming the crystallized film 21B configured of AlAs and subsequently oxidizing part or all thereof. Thereby, a leak current flowing in the crystallized films 21A and 21B is allowed to be decreased. At this time, for example, Ga exists at a rate of, for example, several percent in the crystallized film 21A configured of AlGa$_x$As (X>0), the oxidation rate is slow, and therefore the thickness of the oxidized film is easily controllable. Further, in the foregoing crystallized films 21A and 21B, the active layer 13 is not in contact with Al$_2$O$_3$. Therefore, oxygen (O) does not exist at the interface of the crystallized film 21A and the active layer 13, and therefore a favorable hetero interface is obtainable. In addition, since the insulating film 31 is allowed to be omitted due to the crystallized film 21B containing Al$_2$O$_3$, the light emitting element 1A is formed without performing plasma radiation to the end surface 10E.

[Modification 2]

Figure 12A:
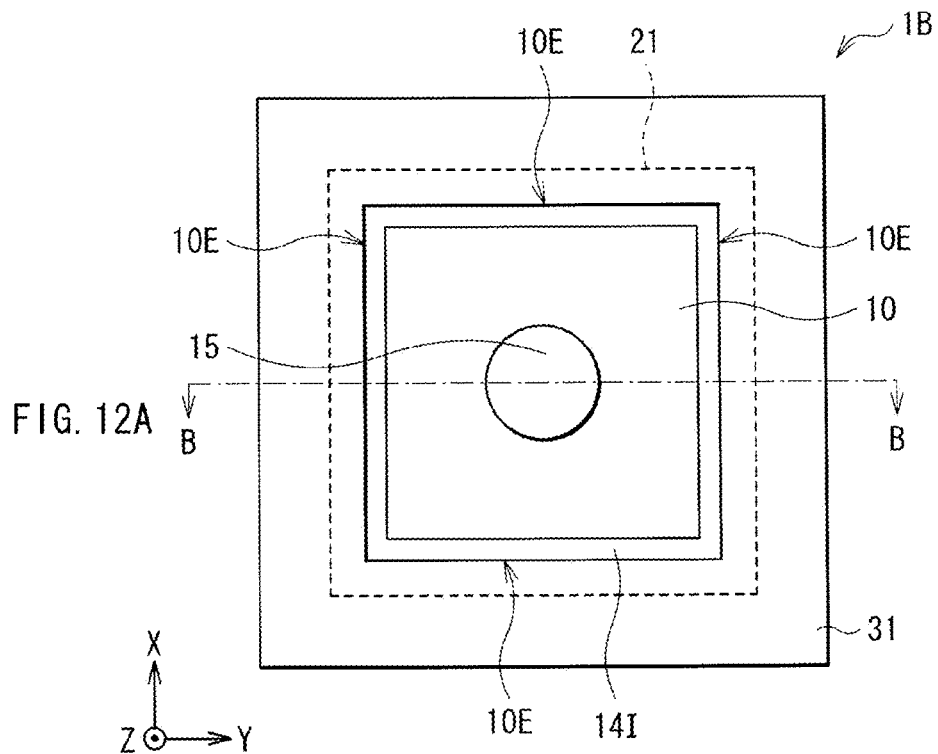
FIGS. 12A and 12B are diagrams illustrating a configuration of a light emitting element according to a modification 2.
Figure 12B:
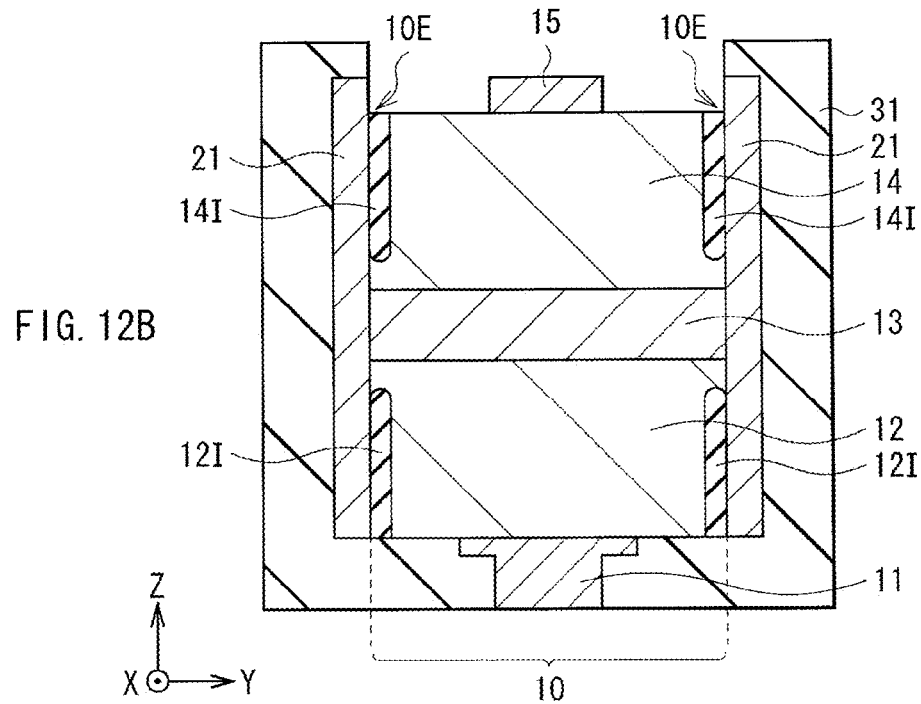

A light emitting element (light emitting element 1B) according to a modification 2 of the foregoing first embodiment has insulating sections (a first insulating section 12I and a second insulating section 14I) in an end portion of the laminated body 10. Except for this point, the light emitting element 1B has a configuration similar to that of the light emitting element 1 according to the first embodiment, and its function and its effect are similar to those of the light emitting element 1 according to the first embodiment. FIG. 12A illustrates a configuration of a top surface (plane surface) of the light emitting element 1B, and FIG. 12B illustrates a configuration of a cross section taken along a line B-B of FIG. 12A.

The first insulating section 12I and the second insulating section 14I being, for example, from 10 to 10000 nm both inclusive wide (in Y-axis direction) are provided in an end portion of the n-type cladding layer 12 and in an end portion of the p-type cladding layer 14, respectively. The widths of the first insulating section 12I and the second insulating section 14I are adjusted as appropriate according to the device size, and the compositions and the thicknesses of the n-type cladding layer 12, the active layer 13, and the p-type cladding layer 14. The first insulating section 12I and the second insulating section 14I are what we call current confinement sections for forming a current injection region.

Since a carrier is not injected into the first insulating section 12I and the second insulating section 14I, nonradiative recombination at the end surface 10E is suppressed more effectively together with the crystallized film 21.

The foregoing light emitting element 1B may be manufactured, for example, as follows. First, as in the light emitting element 1, on the crystal growth substrate 41, the n-type cladding layer 12, the active layer 13, and the p-type cladding layer 14 are formed (FIG. 2A). Next, as illustrated in FIG. 13A, ion implantation (ion injection) into a desired regions of the n-type cladding layer 12 and the p-type cladding layer 14 is performed with the use of B (boron), C (carbon), N (nitrogen), or the like to form the first insulating section 12I and the second insulating section 14I. The first insulating section 12I and the second insulating section 14I may be formed by an oxidation step. For example, the first insulating section 12I and the second insulating section 14I may be formed by forming an AlAs film or the like as the n-type cladding layer 12 and the p-type cladding layer 14 by an MOCVD method and thermally oxidizing the resultant. The first insulating section 12I and the second insulating section 14I may be formed on the lower side of the n-type cladding layer 12 and the upper side of the p-type cladding layer 14, respectively (FIG. 13A). The first insulating section 12I and the second insulating section 14I may be connected with the active layer 13 in between. Alternatively, only one of the first insulating section 12I and the second insulating section 14I may be formed. After the first insulating section 12I and the second insulating section 14I are formed, the resultant is shaped by using the mask 42 so that the first insulating section 12I and the second insulating section 14I are arranged inside the end surface 10E (FIG. 13B). Subsequent steps of manufacturing the light emitting element 1B are similar to those of the light emitting element 1.

[Second Embodiment]

Figure 14A:
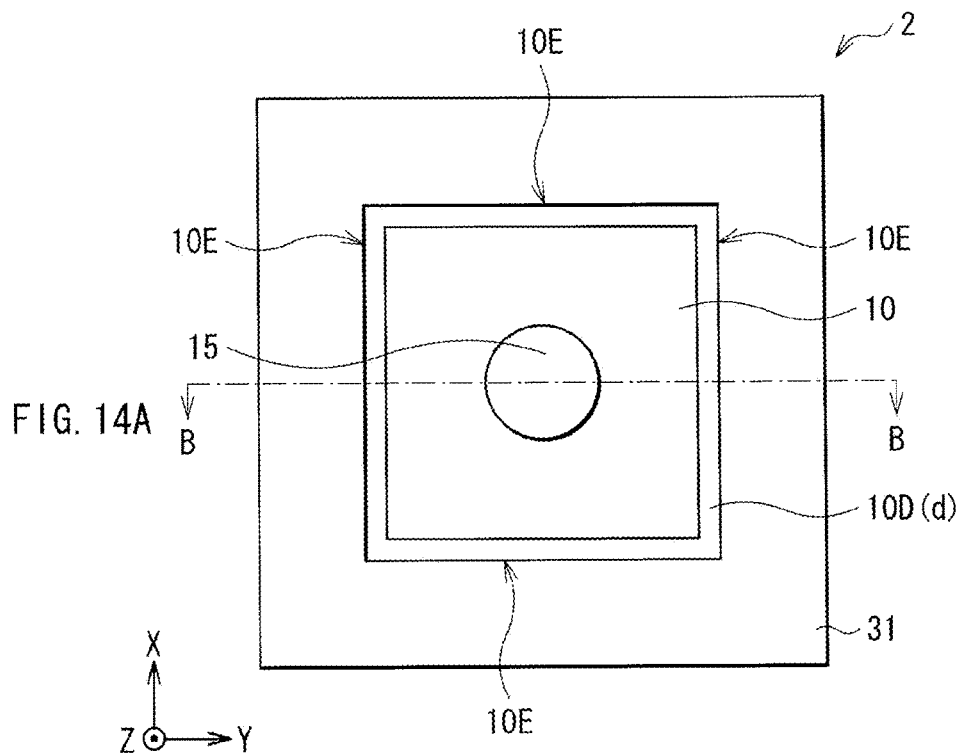
FIGS. 14A and 14B are diagrams illustrating a configuration of a light emitting element according to a second embodiment of the present disclosure.
Figure 14B:
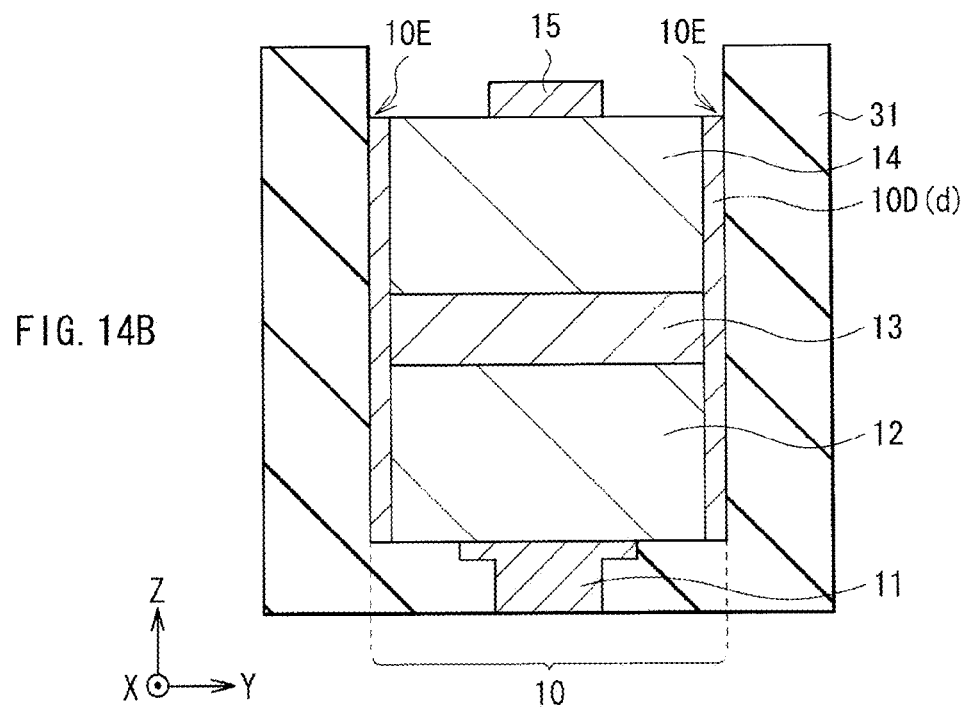

FIGS. 14A and 14B illustrate a configuration of a light emitting element (light emitting element 2) according to a second embodiment of the present technology. FIG. 14A illustrates a configuration of a top surface (plane surface) of the light emitting element 2, and FIG. 14B illustrates a configuration of a cross section taken along a line B-B of FIG. 14A. In the light emitting element 2, a diffusion section 10D is provided in the vicinity of the end surface 10E instead of the crystallized film (crystallized film 21 in FIGS. 1A and 1B). That is, in the light emitting element 2, the diffusion section 10D configures a recombination suppression structure. Except for this point, the light emitting element 2 has a configuration similar to that of the light emitting element 1 according to the foregoing first embodiment.

The diffusion section 10D suppresses nonradiative recombination occurring at the end surface 10E, and is provided in the end portion of the laminated body 10, that is, inside the end surface 10E. It is enough that the diffusion section 10D exists in the end portion of the active layer 13 at minimum. However, alternatively, the diffusion section 10D may exist in an end portion of the whole laminated body 10 (FIGS. 14A and 14B). The width of the diffusion section 10D is, for example, from 10 to 5000 nm both inclusive (in Y-axis direction). The diffusion section 10D includes a diffusion material d for expanding the bandgap of the active layer 13. The diffusion material d is, for example, zinc (Zn), magnesium (Mg), or the like. The width of the diffusion section 10D is adjusted as appropriate according to the device size, and the compositions and the thicknesses of the n-type cladding layer 12, the active layer 13, and the p-type cladding layer 14. Due to a bandgap difference between the end portion (diffusion section 10D) of the active layer 13 and the central portion thereof, occurrence of band shrinkage and deep level are suppressed, and nonradiative recombination occurring at the end surface 10E is prevented. Therefore, the light emission region of the light emitting element 2 is widened to improve the light emission efficiency. Further, in the diffusion section 10D in which the bandgap is expanded, its transparency is increased. Therefore, lowering of extracted light due to light absorption of a semiconductor material itself is suppressed.

The light emitting element 2 may be manufactured, for example, as follows.

Figure 15A:
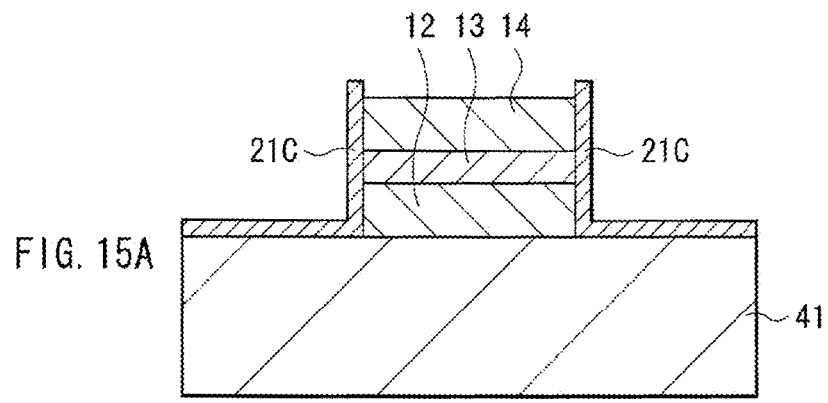
FIGS. 15A, 15B, and 15C are cross-sectional views illustrating a first example of a method of manufacturing the light emitting element illustrated in FIGS. 14A and 14B in order of steps.
Figure 15B:
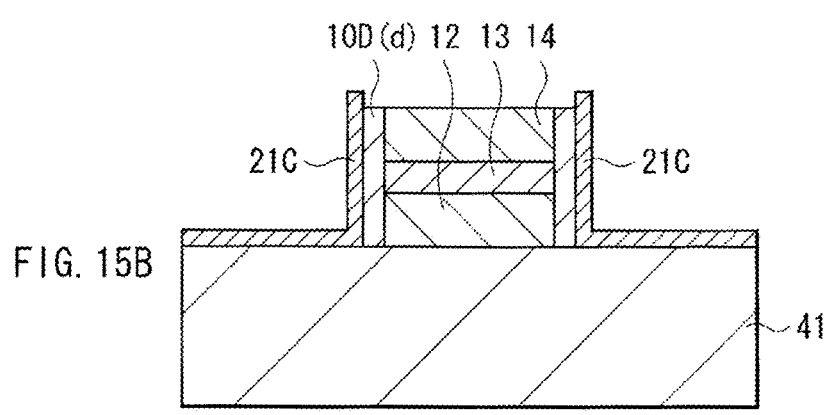
Figure 16:
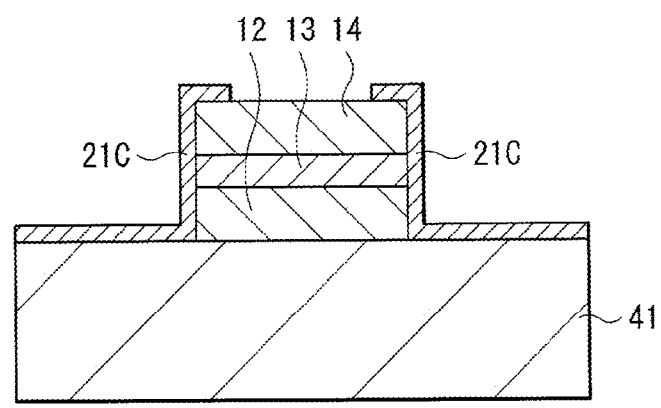
FIG. 16 is a cross-sectional view illustrating another example in one step of the method of manufacturing the light emitting element illustrated in FIGS. 15A, 15B, and 15C.

First, a crystallized film 21C containing the diffusion material d is formed as in the foregoing crystallized film 21 (FIG. 2C). After that, the crystallized film 21C on the top surface of the p-type cladding layer 14 is removed by a method such as dry etching and wet etching (FIG. 15A). At this time, as illustrated in FIG. 16, the crystallized film 21C may remain in the end portion of the top surface of the p-type cladding layer 14. Next, for example, the diffusion material d is diffused in the end portion of the active layer 13 from the crystallized film 21C through the end surface 10E by thermal treatment at 400 to 600 deg C. both inclusive to form the diffusion section 10D (FIG. 15B). Alternatively, Zn may be diffused through a ZnO film or the insulating film 31 configured of SiN, SiO, or the like, instead of the crystallized film 21C.

Figure 15C:
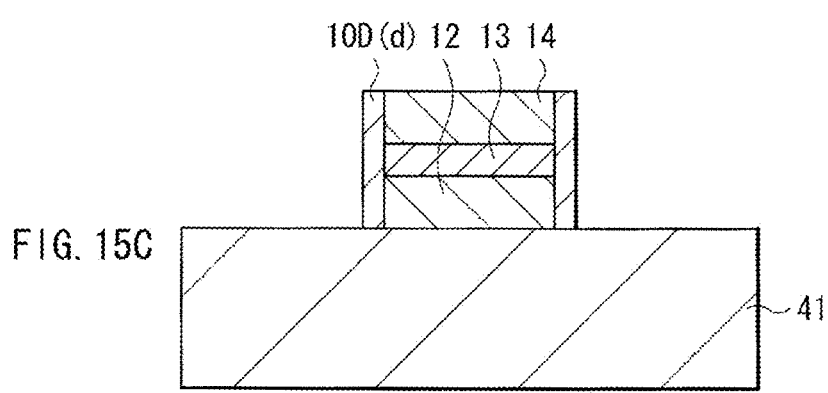

After the diffusion section 10D is formed, the crystallized film 21C is removed by, for example, a method such as dry etching and wet etching (FIG. 15C). By removing the crystallized film 21C containing the diffusion material d, diffusion of the diffusion material d and occurrence of drift are prevented at the time of driving the light emitting element 2. Subsequent steps of forming the p-side electrode 15, the n-side electrode 11, and the like are performed as in the light emitting element 1, and thereby the light emitting element 2 illustrated in FIGS. 14A and 14B is completed. By using the crystallized film 21C, the diffusion section 10D is allowed to be effectively formed in the end portion of the laminated body 10.

Alternatively, for example, the light emitting element 2 may be manufactured by the following method. First, as in the light emitting element 1, on the crystal growth substrate 41, the n-type cladding layer 12, the active layer 13, and the p-type cladding layer 14 are formed (FIG. 2A). Next, on the top surface of the p-type cladding layer 14, a mask 43 and a diffusion source layer 22 are formed in this order (FIG. 17A and FIG. 17B). The diffusion source layer 22 contains the diffusion material d for expanding the bandgap of the active layer 13, and is formed by, for example, an evaporation method, a sputtering method, an MOCVD method, or the like. Subsequently, the diffusion material d is diffused in the active layer 13 from an opening of the mask 43 through the p-type cladding layer 14 by, for example, thermal treatment or the like to form the diffusion section 10D (FIG. 17C).

After the diffusion section 10D is formed, the diffusion source layer 22 and the mask 43 are removed. Subsequently, the p-side electrode 15, the n-side electrode 11, and the like are formed as in the light emitting element 1. After that, the laminated body 10 is formed so that the diffusion section 10D is arranged inside the end surface 10E, and thereby the light emitting element 2 is completed.

Figure 18A:
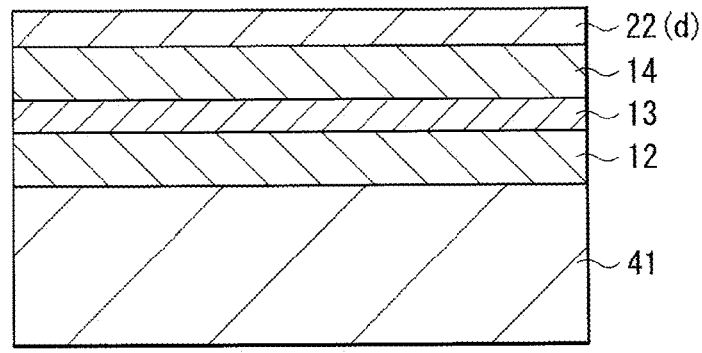
FIGS. 18A, 18B, and 18C are cross-sectional views illustrating a third example of the method of manufacturing the light emitting element illustrated in FIGS. 14A and 14B in order of steps.
Figure 18B:
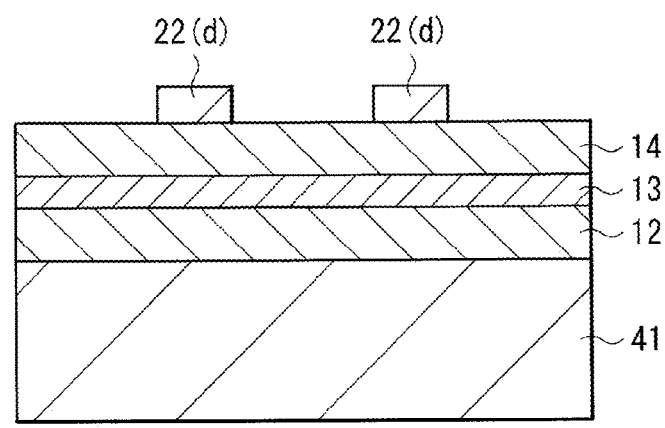
Figure 18C:
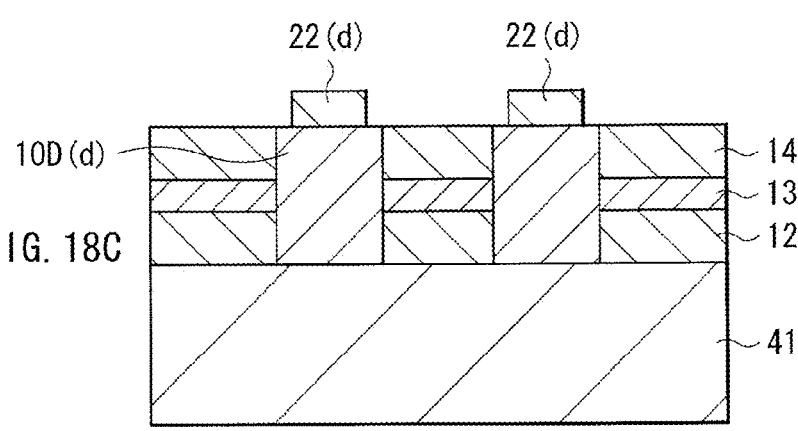

Alternatively, the diffusion section 10D may be formed without using a mask (mask 43) as illustrated in FIGS. 18A to 18C. More specifically, first, the diffusion source layer 22 is formed on the top surface of the p-type cladding layer 14 (FIG. 18A). The resultant is patterned by performing, for example, a photolithography step and RIE (reactive ion etching) (FIG. 18B). An unnecessary portion of the diffusion source layer 22 may be removed by wet etching instead of RIE. Subsequently, the diffusion section 10D is configured of the patterned diffusion source layer 22 (FIG. 18C).

Figure 19A:
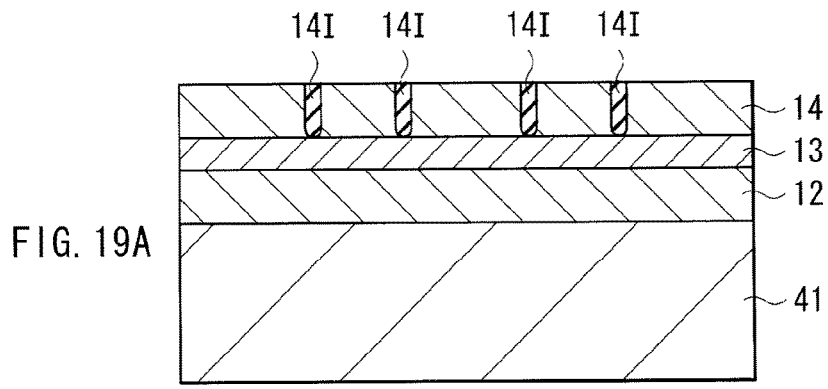
FIGS. 19A, 19B, and 19C are cross-sectional views illustrating a fourth example of the method of manufacturing the light emitting element illustrated in FIGS. 14A and 14B in order of steps.
Figure 19B:
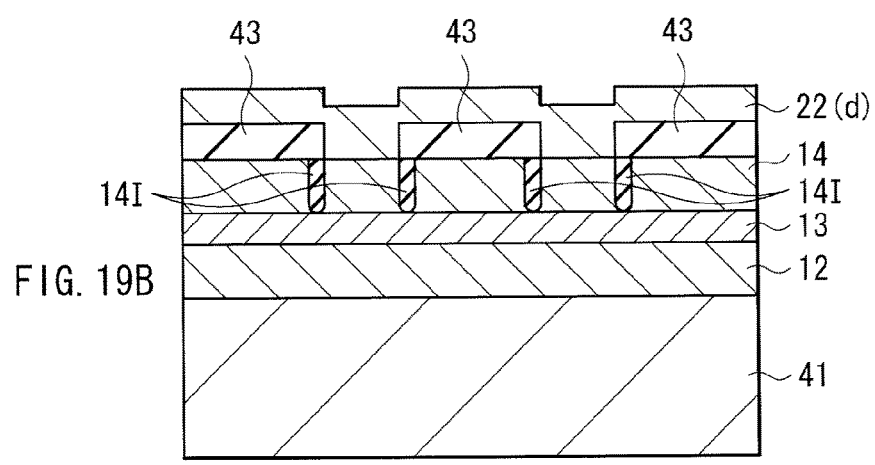
Figure 19C:
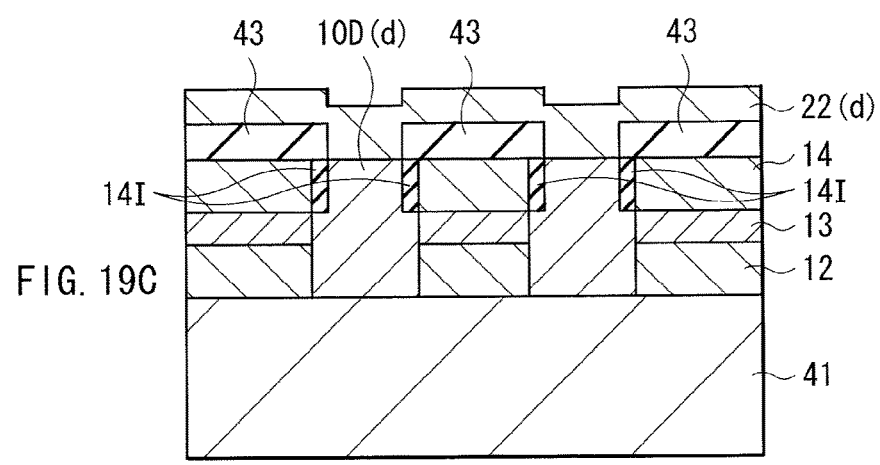

Alternatively, the diffusion section 10D may be formed by using the second insulating section 14I of the p-type cladding layer 14. First, as illustrated in FIG. 19A, the second insulating section 14I is formed in two desired locations (the inner periphery and the outer periphery) of the p-type cladding layer 14 by, for example, ion implantation. A region between the foregoing two locations of the second insulating section 14I becomes a region where the diffusion section 10D is to be formed. Next, the mask 43 is formed on the top surface of the p-type cladding layer 14 so that its opening section corresponds to the region where the diffusion section 10D is to be formed, and subsequently the diffusion source layer 22 is formed on the mask 43 (FIG. 19B). Alternatively, as described above (FIGS. 18A to 18C), the patterned diffusion source layer 22 may be used without using the mask 43. After the diffusion source layer 22 is formed, the diffusion section 10D is formed by, for example, performing thermal treatment or the like (FIG. 19C).

[Modification 3]

Figure 20:
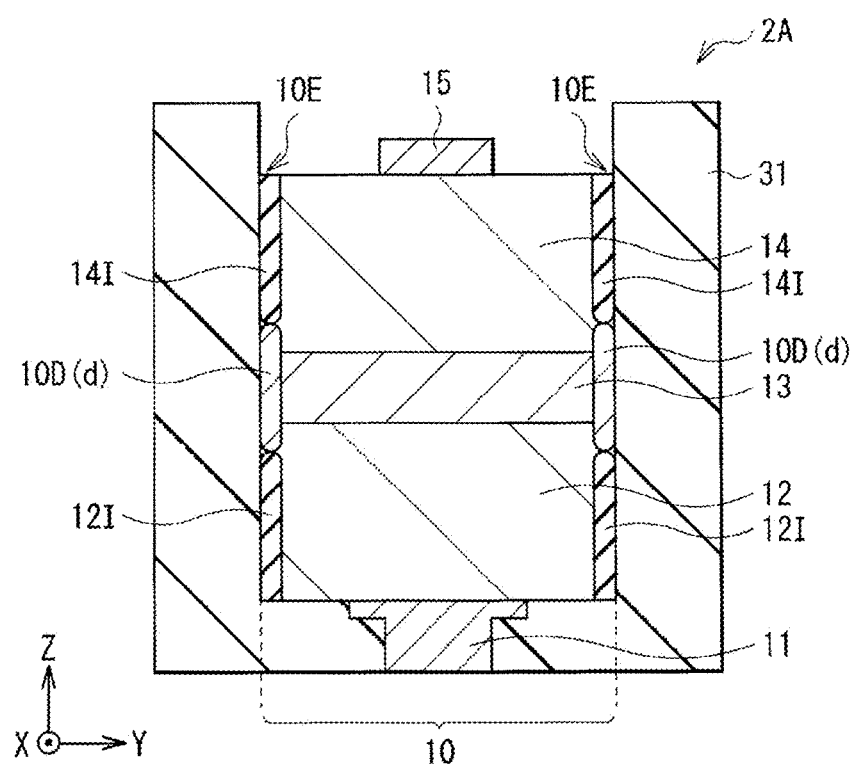
FIG. 20 is a cross-sectional view illustrating a configuration of a light emitting element according to a modification 3.

FIG. 20 illustrates a cross-sectional configuration of a light emitting element (light emitting element 2A) according to a modification 3 of the foregoing second embodiment. In the light emitting element 2A, the first insulating section 12I and the second insulating section 14I are provided in the end portion of the n-type cladding layer 12 and in the end portion of the p-type cladding layer 14, respectively. Except for this point, the light emitting element 2A has a configuration similar to that of the light emitting element 2 according to the foregoing second embodiment, and its function and its effect are similar to those of the light emitting element 2 according to the second embodiment.

As in the light emitting element 1B (FIGS. 12A and 12B), the first insulating section 12I is provided on the bottom surface side of the n-type cladding layer 12, and the second insulating section 14I is provided on the top surface side of the p-type cladding layer 14. In the light emitting element 2A, as described later, the diffusion section 10D is formed between the first insulating section 12I and the second insulating section 14I. That is, the first insulating section 12I and the second insulating section 14I suppress nonradiative recombination, and function as diffusion blocks at the time of forming the diffusion section 10D.

The light emitting element 2A may be manufactured, for example, as follows.

Figure 21A:
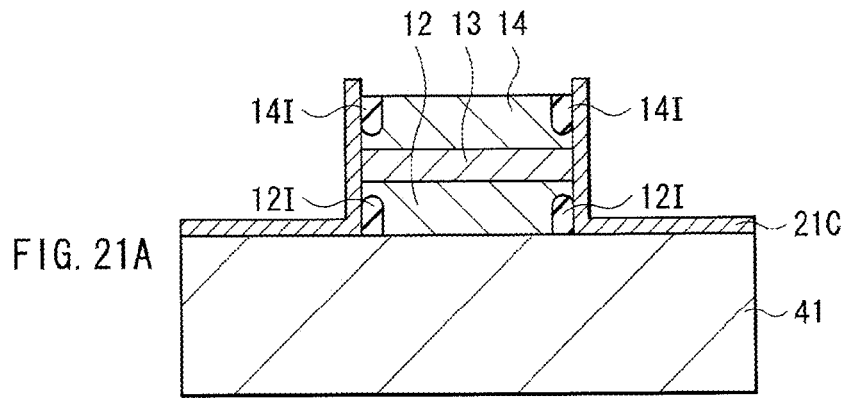
FIGS. 21A, 21B, and 21C are cross-sectional views illustrating an example of a method of manufacturing the light emitting element illustrated in FIG. 20 in order of steps.
Figure 21B:
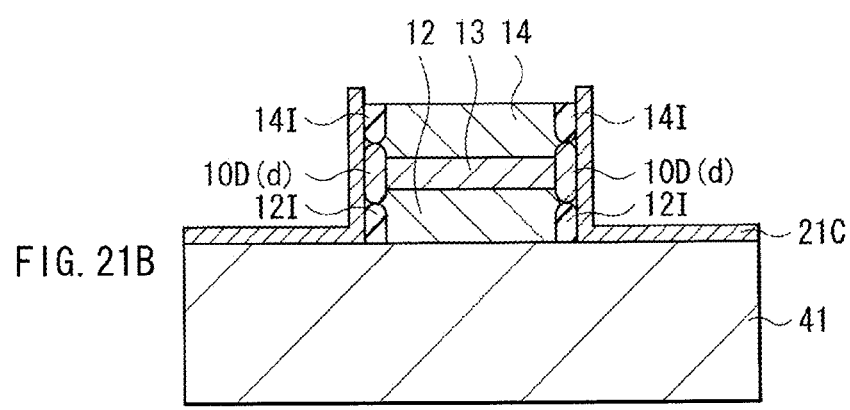

First, as in the light emitting element 1B, the first insulating section 12I and the second insulating section 14I are formed in the n-type cladding layer 12 and the p-type cladding layer 14, respectively, to obtain a desired shape (FIG. 13B). Next, as in the light emitting element 2, the crystallized film 21C containing the diffusion material d is formed, and subsequently the crystallized film 21C on the top surface of the p-type cladding layer 14 is removed (FIG. 21A). Subsequently, the diffusion material d is diffused between the first insulating section 12I and the second insulating section 14I from the end surface 10E by, for example, thermal treatment or the like to form the diffusion section 10D (FIG. 21B). The diffusion section 10D is preferably formed in a narrow region in the lamination direction (Z-axis direction) as much as possible centering on the end portion of the active layer 13. In this case, by forming the first insulating section 12I and the second insulating section 14I, diffusion of the diffusion material d into the bottom surface side of the n-type cladding layer 12 and the top surface side of the p-type cladding layer 14 is limited (diffusion block) and the diffusion section 10D is formed centering on the active layer 13.

Figure 21C:
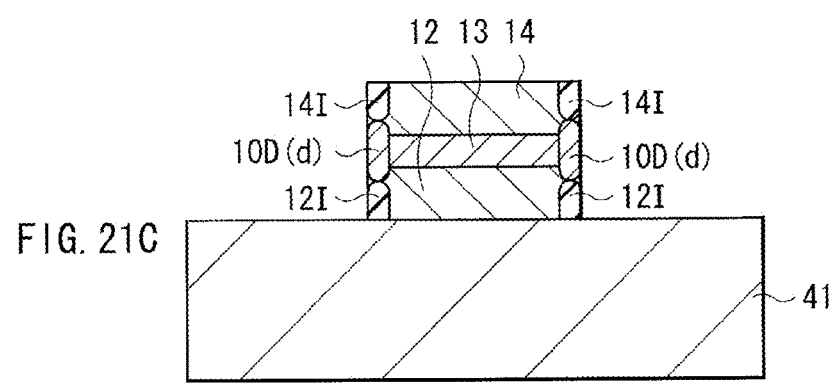

After the diffusion section 10D is formed, the crystallized film 21C is removed (FIG. 21C). As in the light emitting element 1, the p-side electrode 15, the n-side electrode 11, and the like are formed, and thereby the light emitting element 2A is completed.

[Third Embodiment]

Figure 22A:
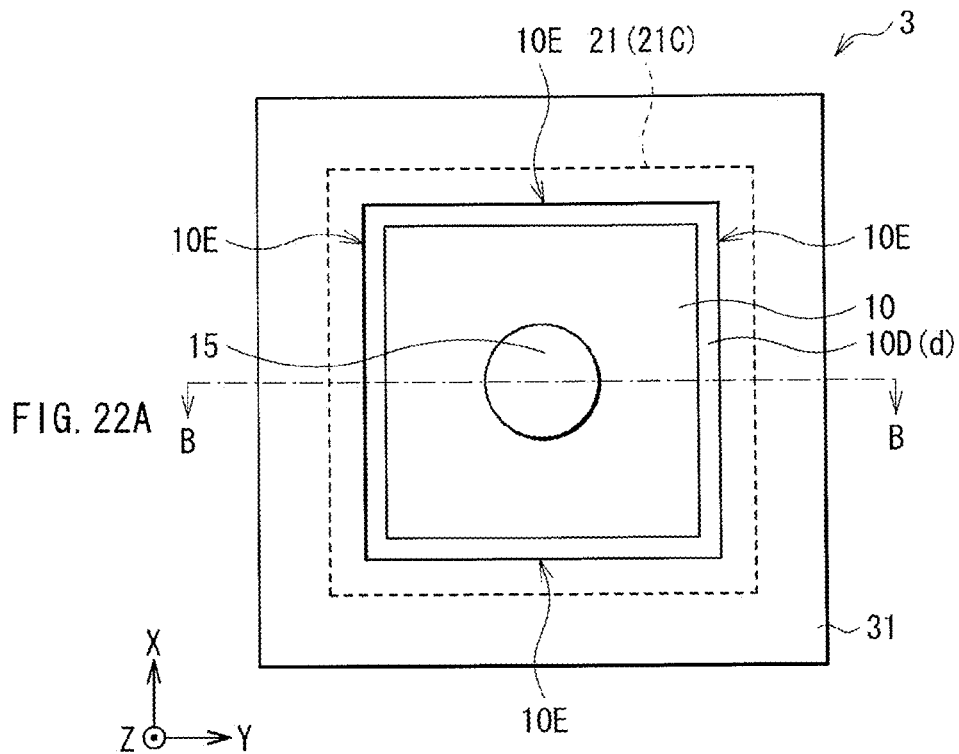
FIGS. 22A and 22B are diagrams illustrating a configuration of a light emitting element according to a third embodiment of the present disclosure.
Figure 22B:
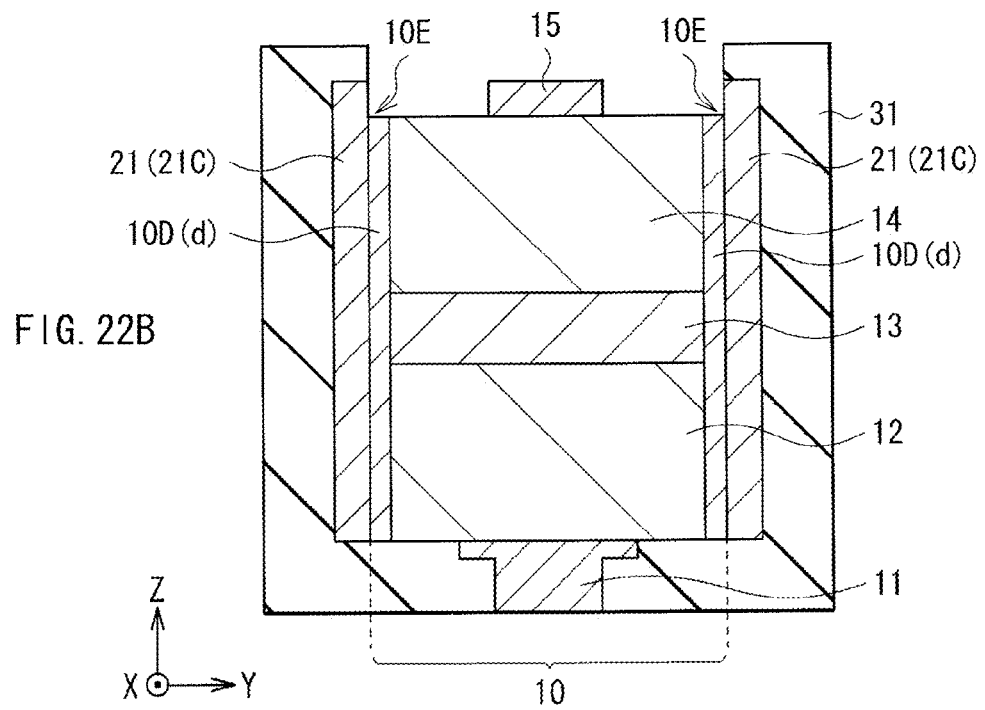

FIGS. 22A and 22B illustrate a configuration of a light emitting element (light emitting element 3) according to a third embodiment of the present technology. FIG. 22A illustrates a configuration of a top surface (plane surface) of the light emitting element 3, and FIG. 22B illustrates a configuration of a cross section taken along a line B-B of FIG. 22A. In the light emitting element 3, the crystallized film 21 (or the crystallized film 21C) and the diffusion section 10D are provided in the vicinity of the end surface 10E of the laminated body 10. Except for this point, the light emitting element 3 has a configuration similar to that of the light emitting element 1 according to the foregoing first embodiment.

As in the light emitting element 1, the crystallized film 21 is made of a material having a larger bandgap than that of the component material of the active layer 13. The crystallized film 21 is in contact with the end surface 10E of the laminated body 10, and covers the same from the outside. Meanwhile, the diffusion section 10D is provided in the end portion of the laminated body 10 (inside the end surface 10E) as in the light emitting element 2, and contains the diffusion material d to expand the bandgap of the active layer 13. As described above, since the light emitting element 3 has both the crystallized film 21 and the diffusion section 10D, nonradiative recombination is more effectively suppressed form outside and inside of the end surface 10E compared to a case in which only one of the crystallized film 21 and the diffusion section 10D is provided.

The crystallized film 21 may be insulative. By the insulative crystallized film 21, strength against electric breakdown such as ESD (electro-static discharge) is improved. This is particularly effective in the light emitting element 3 in which the strength against electric breakdown is easily lowered since the diffusion section 10D is provided. Further, by providing the insulative crystallized film 21, the insulating film 31 may be omitted.

The light emitting element 3 is formed by, for example, forming the crystallized film 21C containing the diffusion material d to form the diffusion section 10D as in the light emitting element 2 (FIG. 15B), and subsequently not removing but leaving the crystallized film 21C. Alternatively, the light emitting element 3 may be formed by, for example, forming the diffusion section 10D without using the crystallized film 21C as illustrated in FIG. 17A to 19C, and separately forming the crystallized film 21. The insulative crystallized films 21 and 21C may be formed by, for example, forming the diffusion section 10D, and subsequently oxidizing the crystallized films 21 and 21C. In the case where the crystallized film 21C is used, by such an insulation step, the diffusion material d is prevented from being diffused into the laminated body 10 at the time of driving the light emitting element 3.

[Modification 4]

Figure 23:
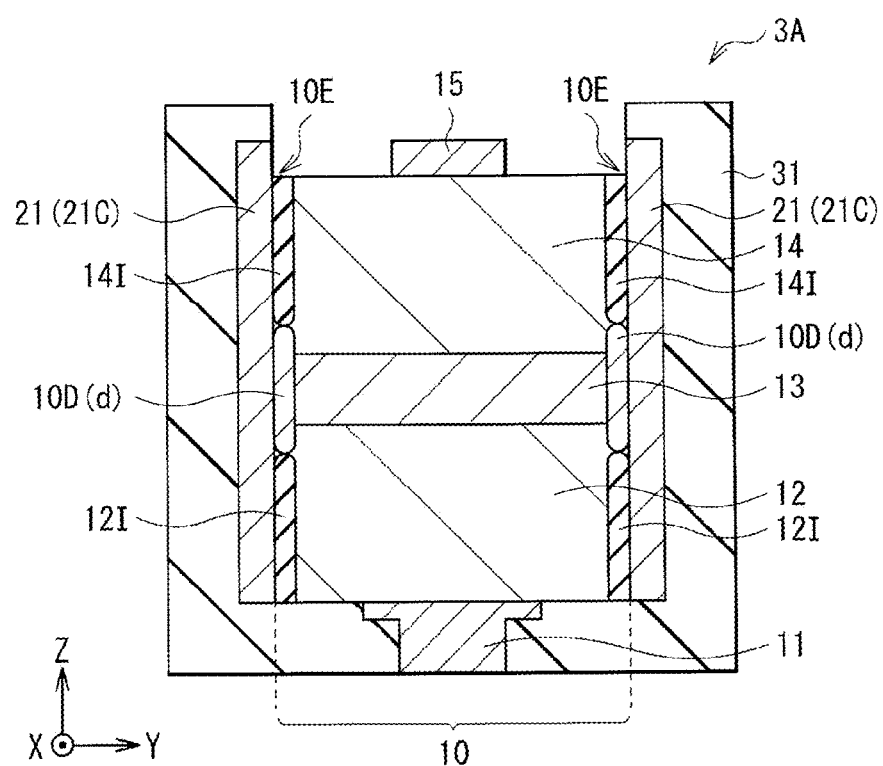
FIG. 23 is a cross-sectional view illustrating a configuration of a light emitting element according to a modification 4.

FIG. 23 illustrates a cross-sectional configuration of a light emitting element (light emitting element 3A) according to a modification 4 of the foregoing third embodiment. In the light emitting element 3A, the first insulating section 12I and the second insulating section 14I are provided in the end portion of the n-type cladding layer 12 and in the end portion of the p-type cladding layer 14, respectively. Except for this point, the light emitting element 3A has a configuration similar to that of the light emitting element 3 according to the foregoing third embodiment, and its function and its effect are similar to those of the light emitting element 3 according to the third embodiment.

In the light emitting element 3A, as in the light emitting element 2A, the first insulating section 12I and the second insulating section 14I each have a diffusion block function, and the diffusion section 10D is formed between the first insulating section 12I and the second insulating section 14I.

[Light Emitting Device]

Figure 24A:
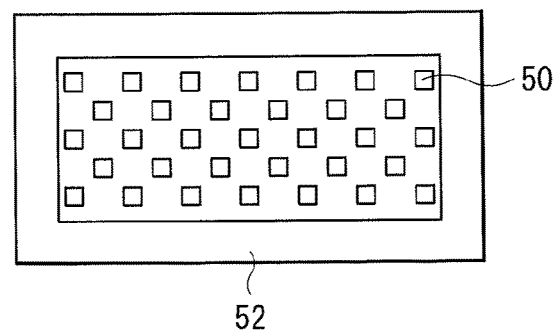
FIGS. 24A and 24B are diagrams illustrating a configuration of a light emitting device to which the light emitting element illustrated in FIGS. 1A and 1B and the like is applied.
Figure 24B:
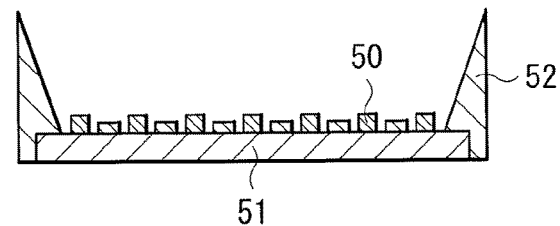

As illustrated in FIGS. 24A and 24B, the light emitting elements 1, 1A, 1B, 2, 2A, 3, and 3A described in the foregoing embodiments and the foregoing modifications are applicable to a light emitting device 5 using the same as a light source 50. FIG. 24A illustrates a configuration of a plane surface of the light emitting device 5, and FIG. 24B illustrates a configuration of a cross section thereof. In the light emitting device 5, a plurality of light sources 50 are arranged on a drive section 51. The light generated in the light sources 50 is adjusted by a light reflecting section 52 to have desired light distribution characteristics, and is extracted. The number of light sources 50 (light emitting elements) arranged in the light emitting device 5 may be one.

Figure 25:
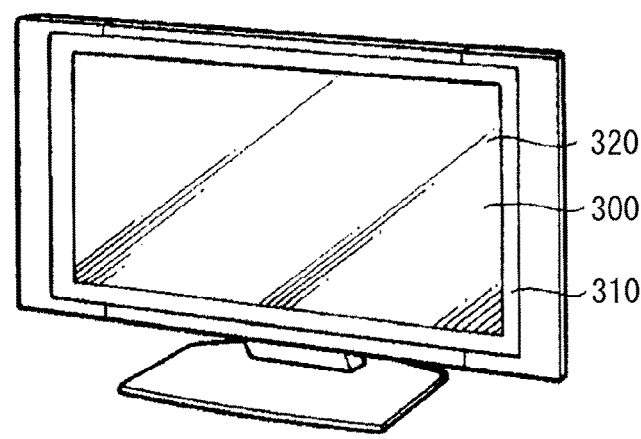
FIG. 25 is a perspective view illustrating an appearance of an application example 1 of the light emitting device illustrated in FIGS. 24A and 24B.

FIG. 25 illustrates an appearance of a display to which the foregoing light emitting device 5 is applied. The display has, for example, an image display screen section 300 including a front panel 310 and a filter glass 320. The image display screen section 300 is configured of the light emitting device 5 according to the foregoing embodiment.

Figure 26:
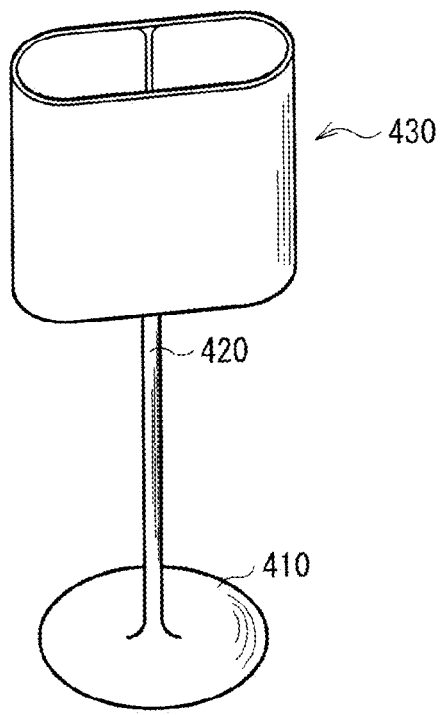
FIG. 26 is a perspective view illustrating an appearance of an application example 2.
Figure 27:
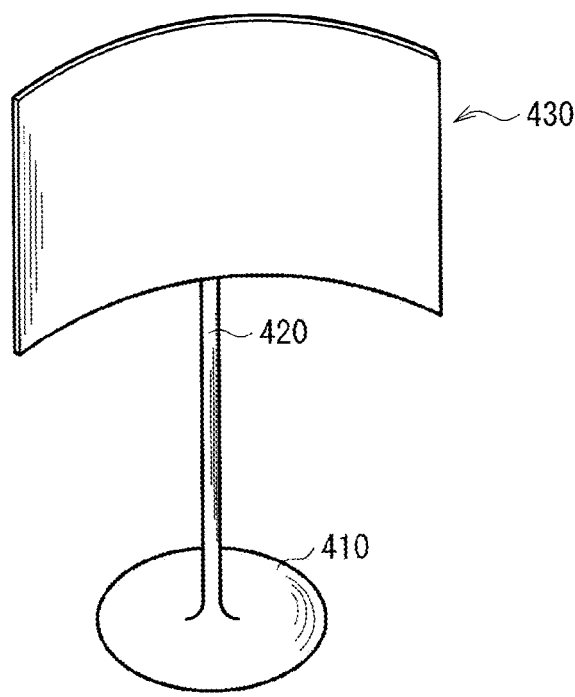
FIG. 27 is a perspective view illustrating another example of the appearance of the application example 2.

FIG. 26 and FIG. 27 illustrate appearances of an illuminator to which the foregoing light emitting device 5 is applied. In the illuminator, for example, an illuminating section 430 is attached to a pole brace 420 provided on a base 410. The illuminating section 430 is configured of the foregoing light emitting device 5.

Figure 28:
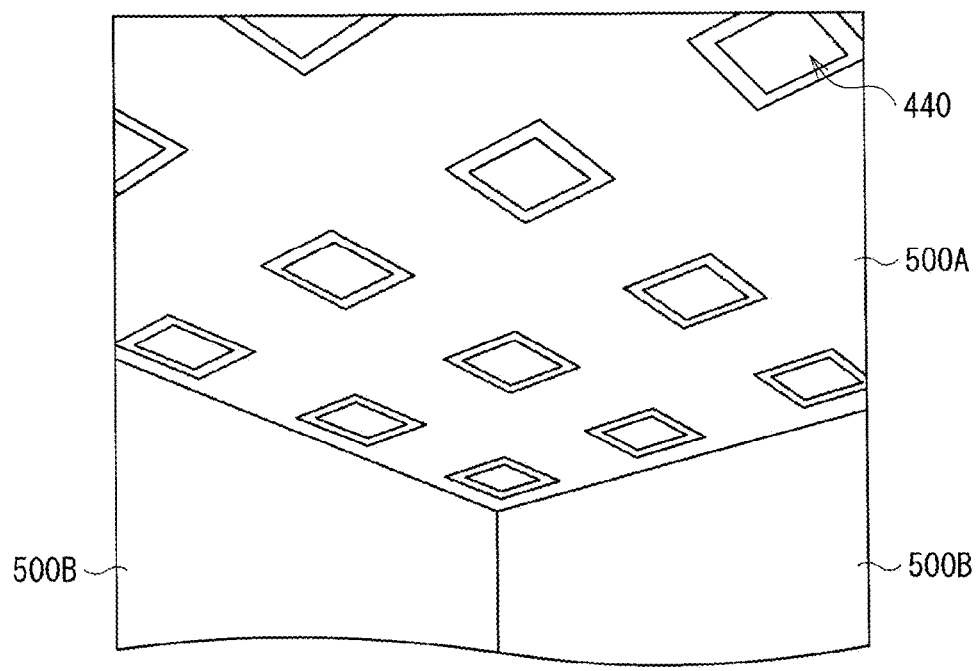
FIG. 28 is a perspective view illustrating an appearance of an application example 3.

FIG. 28 illustrates an appearance of a room illuminator to which the foregoing light emitting device 5 is applied. The room illuminator has, for example, a illuminating section 440 configured of the foregoing light emitting device 5. An appropriate number of illuminating sections 440 are arranged on a ceiling 500A of a building at appropriate intervals. The illuminating section 440 may be arranged not only on the ceiling 500A, but also on an arbitrary location such as a wall 500B and a floor (not illustrated), according to the application. In addition, the foregoing light emitting device 5 is applicable to an indicator or the like.

While the present technology has been described with reference to the embodiments and the modifications, the present technology is not limited to the foregoing embodiments and the like, and various modifications may be made. For example, in the foregoing embodiments, the description has been given of the case in which the laminated body 10 is in the shape of a square pole. However, alternatively, the laminated body 10 may be in the shape of a cylindrical column, or may in the shape of a tapered circular truncated cone or the like. Further, an insulating film with concavity and convexity may be provided on the top surface of the p-type cladding layer 14.

Further, in the foregoing embodiments and the like, the case in which the active layer 13 is made of an Al-, In-, Ga-, P-, or As-based material has been exemplified. Alternatively, the active material layer may be made of an N-based material.

Furthermore, the material, the thickness, the film-forming method, the film-forming conditions, and the like of each section are not limited to those described in the foregoing embodiments and the like, and other material, other thickness, other film-forming method, and other film-forming conditions may be adopted. For example, the formation order of the respective sections described in the foregoing embodiments and the like may be exchangeable arbitrarily.

In addition, in the foregoing embodiments and the like, the case in which light is extracted from the top surface side of the p-type cladding layer 14 (in the upward direction in FIG. 1B) has been exemplified. Alternatively, light may be extracted from the n-type cladding layer 12 (n-side electrode 11) side.

It is possible to achieve at least the following configurations from the above-described exemplary embodiments and the modifications of the disclosure.

(1) A light emitting element including:
a laminated body including a first conductive semiconductor layer, an active layer, and a second conductive semiconductor layer in this order, the second conductive semiconductor layer having a light extraction surface; and
a recombination suppression structure provided in vicinity of an end surface of the active layer, the recombination suppression structure having a bandgap larger than a bandgap of the active layer.

(2) The light emitting element according to (1), wherein the recombination suppression structure is made of a component material that has a bandgap larger than a bandgap of a component material of the active layer, the recombination suppression structure being configured of a crystallized film that covers the end surface of the active layer from outside.

(3) The light emitting element according to (2), wherein the crystallized film covers an end surface of the laminated body as a whole.

(4) The light emitting element according to (2) or (3), wherein
the active layer includes one or more elements of Al, In, Ga, P, and As, and
the crystallized film includes one or more elements included in the active layer.

(5) The light emitting element according to any one of (2) to (4), wherein
the crystallized film includes $Al_2O_3$, and
the $Al_2O_3$ is obtained by oxidizing a film including Al.

(6) The light emitting element according to (5), wherein the film including Al is an AlAs film.

(7) The light emitting element according to any one of (2) to (6), wherein a film thickness of the crystallized film is equal to or smaller than about 100 nanometers.

(8) The light emitting element according to any one of (2) to (7), wherein the crystallized film includes a plurality of films having different bandgap sizes.

(9) The light emitting element according to (8), wherein
out of the plurality of films, a film most distant from the active layer includes $Al_2O_3$, and
the $Al_2O_3$ is obtained by forming a film including Al and subsequently oxidizing the film including the Al.

(10) The light emitting element according to any one of (2) to (9), including a diffusion section in an end portion of the active layer, the diffusion section including a material that expands the bandgap of the active layer.

(11) The light emitting element according to (10), wherein the material is zinc (Zn).

(12) The light emitting element according to any one of (1) to (11), including an insulating section in an end portion of the laminated body.

(13) The light emitting element according to (12), including a diffusion section provided between a first insulating section and a second insulating section, the diffusion section including a material that expands the bandgap of the active layer, wherein the insulating section includes the first insulating section and the second insulating section, the first insulating section being located on an end portion of the first conductive semiconductor layer, the second insulating section being located on an end portion of the second conductive semiconductor layer.

(14) The light emitting element according to any one of (1) to (13), wherein an area of the active layer is equal to or smaller than about 2500 square micrometers.

(15) The light emitting element according to (1), wherein the recombination suppression structure is configured of a diffusion section, the diffusion section including a material that expands the bandgap of the active layer, the diffusion section being provided in an end portion of the active layer.

(16) A light emitting device including a light emitting element, the light emitting element including:

a laminated body including a first conductive semiconductor layer, an active layer, and a second conductive semiconductor layer in this order, the second conductive semiconductor layer having a light extraction surface; and a recombination suppression structure provided in vicinity of an end surface of the active layer, the recombination suppression structure having a bandgap larger than a bandgap of the active layer.

(17) A method of manufacturing a light emitting element including:

forming a laminated body including a first conductive semiconductor layer, an active layer, and a second conductive semiconductor layer in this order, the second conductive semiconductor layer having a light extraction surface; and forming a recombination suppression structure provided in vicinity of an end surface of the active layer, the recombination suppression structure having a bandgap larger than a bandgap of the active layer.

(18) The method of manufacturing a light emitting element according to (17), wherein the recombination suppression structure is made of a component material that has a bandgap larger than a bandgap of a component material of the active layer, the recombination suppression structure being configured of a crystallized film that covers the end surface of the active layer from outside, and the crystallized film is formed by one of an MOCVD (metal organic chemical vapor deposition) method and a sputtering method.

(19) The method of manufacturing a light emitting element according to (18), wherein the laminated body is annealed at a temperature of about 700 degrees Celsius or more, and the crystallized film is subsequently formed.

(20) The method of manufacturing a light emitting element according to (18) or (19), wherein the first conductive semiconductor layer, the active layer, the second conductive semiconductor layer, and the crystallized film are formed in this order, and subsequently, the crystallized film on a top surface of the second conductive semiconductor layer is removed to obtain the light extraction surface.

The present disclosure contains subject matter related to that disclosed in Japanese Priority Patent Application JP 2011-234637 filed in the Japanese Patent Office on Oct. 26, 2011 and Japanese Priority Patent Application JP 2011-283570 filed in the Japanese Patent Office on Dec. 26, 2011, the entire contents of which is hereby incorporated by reference.

It should be understood by those skilled in the art that various modifications, combinations, sub-combinations and alternations may occur depending on design requirements and other factors insofar as they are within the scope of the appended claims or the equivalents thereof.

What is claimed is:

1. A light emitting element comprising:

a laminated body including a first conductive semiconductor layer, an active layer, and a second conductive semiconductor layer in this order, the second conductive semiconductor layer having a light extraction surface; and a recombination suppression structure provided in vicinity of an end surface of the active layer, the recombination suppression structure having a bandgap larger than a bandgap of the active layer, wherein, an area of the active layer is equal to or smaller than about 2500 square micrometers.

2. The light emitting element according to claim 1, wherein the recombination suppression structure is made of a component material that has a bandgap larger than a bandgap of a component material of the active layer, the recombination suppression structure being configured of a crystallized film that covers the end surface of the active layer from outside.

3. The light emitting element according to claim 2, wherein the crystallized film covers an end surface of the laminated body as a whole.

4. The light emitting element according to claim 2, wherein:

the active layer includes one or more elements of Al, In, Ga, P, and As, and the crystallized film includes one or more elements included in the active layer.

5. The light emitting element according to claim 2, wherein:

the crystallized film includes $Al_2O_3$, and the $Al_2O_3$ is obtained by oxidizing a film including Al.

6. The light emitting element according to claim 5, wherein the film including Al is an AlAs film.

7. The light emitting element according to claim 2, wherein a film thickness of the crystallized film is equal to or smaller than about 100 nanometers.

8. The light emitting element according to claim 2, wherein the crystallized film includes a plurality of films having different bandgap sizes.

9. The light emitting element according to claim 8, wherein:

out of the plurality of films, a film most distant from the active layer includes $Al_2O_3$, and the $Al_2O_3$ is obtained by forming a film including Al and subsequently oxidizing the film including the Al.

10. The light emitting element according to claim 2, comprising a diffusion section in an end portion of the active layer, the diffusion section including a material that expands the bandgap of the active layer.

11. The light emitting element according to claim 10, wherein the material is zinc (Zn).

12. The light emitting element according to claim 1, comprising an insulating section in an end portion of the laminated body.

13. The light emitting element according to claim 12, comprising
- a diffusion section provided between a first insulating section and a second insulating section, the diffusion section including a material that expands the bandgap of the active layer,
  wherein,
    the insulating section includes the first insulating section and the second insulating section, the first insulating section being located on an end portion of the first conductive semiconductor layer, the second insulating section being located on an end portion of the second conductive semiconductor layer.

14. The light emitting element according to claim 1, wherein the recombination suppression structure is configured of a diffusion section, the diffusion section including a material that expands the bandgap of the active layer, the diffusion section being provided in an end portion of the active layer.

15. A light emitting device including a light emitting element, the light emitting element comprising:
- a laminated body including a first conductive semiconductor layer, an active layer, and a second conductive semiconductor layer in this order, the second conductive semiconductor layer having a light extraction surface; and
- a recombination suppression structure provided in vicinity of an end surface of the active layer, the recombination suppression structure having a bandgap larger than a bandgap of the active layer,
  wherein
    an area of the active layer is equal to or smaller than about 2500 square micrometers.

16. A light emitting element comprising:
- a laminated body including a first conductive semiconductor layer, an active layer, and a second conductive semiconductor layer in this order, the second conductive semiconductor layer having a light extraction surface;
- a recombination suppression structure provided in vicinity of an end surface of the active layer, the recombination suppression structure having a bandgap larger than a bandgap of the active layer;
- an insulating section in an end portion of the laminated body; and
- a diffusion section provided between a first insulating section and a second insulating section, the diffusion section including a material that expands the bandgap of the active layer,
  wherein,
    the insulating section includes the first insulating section and the second insulating section, the first insulating section being located on an end portion of the first conductive semiconductor layer, the second insulating section being located on an end portion of the second conductive semiconductor layer.

17. A light emitting element comprising:
- a laminated body including a first conductive semiconductor layer, an active layer, and a second conductive semiconductor layer in this order, the second conductive semiconductor layer having a light extraction surface; and
- a recombination suppression structure provided in vicinity of an end surface of the active layer, the recombination suppression structure having a bandgap larger than a bandgap of the active layer,
  wherein,
    the recombination suppression structure is configured of a diffusion section, the diffusion section including a material that expands the bandgap of the active layer, the diffusion section being provided in an end portion of the active layer.

* * * * *